(12) United States Patent
Kurokawa

(10) Patent No.: US 8,908,406 B2
(45) Date of Patent: Dec. 9, 2014

(54) CACHE MEMORY AND METHOD FOR DRIVING THE SAME

(75) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 371 days.

(21) Appl. No.: 13/484,013

(22) Filed: May 30, 2012

(65) Prior Publication Data

US 2012/0314512 A1 Dec. 13, 2012

(30) Foreign Application Priority Data

Jun. 9, 2011 (JP) .................................. 2011-128769

(51) Int. Cl.
*G11C 15/00* (2006.01)
*G06F 12/08* (2006.01)
*H01L 27/12* (2006.01)
*G11C 7/10* (2006.01)

(52) U.S. Cl.
CPC .... *H01L 27/1225* (2013.01); *G06F 2212/1028* (2013.01); *G06F 12/0895* (2013.01); *Y02B 60/1225* (2013.01); *G06F 12/0864* (2013.01); *G11C 7/1006* (2013.01)
USPC ....................................... 365/49.1; 365/49.17

(58) Field of Classification Search
USPC .................... 365/49.1, 49.17, 49.11
See application file for complete search history.

(56) References Cited

U.S. PATENT DOCUMENTS

| | | | |
|---|---|---|---|
| 5,734,914 A | 3/1998 | Nakamura et al. | |
| 5,761,715 A | 6/1998 | Takahashi | |
| 5,845,309 A | 12/1998 | Shirotori et al. | |
| 5,870,616 A | 2/1999 | Loper et al. | |
| 6,684,298 B1 | 1/2004 | Dwarkadas et al. | |
| 6,807,077 B2 * | 10/2004 | Noda et al. .................. | 365/49.17 |
| 6,987,682 B2 * | 1/2006 | Ma et al. ..................... | 365/49.15 |
| 7,069,388 B1 | 6/2006 | Greenfield et al. | |
| 7,257,678 B2 | 8/2007 | Golden et al. | |
| 7,418,553 B2 | 8/2008 | Yoshimi | |
| 7,437,513 B2 | 10/2008 | Saida et al. | |

(Continued)

FOREIGN PATENT DOCUMENTS

| | | |
|---|---|---|
| CN | 1637934 A | 7/2005 |
| CN | 1647279 A | 7/2005 |

(Continued)

OTHER PUBLICATIONS

Hojung Kim et al.; "Three-Dimensional Integration Approach to High-Density Memory Devices"; IEEE Transactions on Electron Devices; 2011; pp. 3820-3828; vol. 58, No. 11.

(Continued)

*Primary Examiner* — Vu Le
(74) *Attorney, Agent, or Firm* — Fish & Richardson P.C.

(57) ABSTRACT

A cache memory which can operate with less power consumption and has an improved cache hit rate and a method for driving the cache memory are provided. Two data storage portions (a first storage portion and a second storage portion) and one data transfer portion are provided in one memory cell in a memory set included in a cache memory, and arranged so that data can be transferred between the two storage portions via the data transfer portion. One of the two data storage portions can store data input from the outside and output data to a comparison circuit paired with the memory set.

37 Claims, 13 Drawing Sheets

(56) References Cited

U.S. PATENT DOCUMENTS

| | | |
|---|---|---|
| 7,443,717 B2 | 10/2008 | Fujita et al. |
| 7,502,887 B2 | 3/2009 | Tanaka et al. |
| 7,606,976 B2 | 10/2009 | Raghuvanshi |
| 7,674,650 B2 | 3/2010 | Akimoto et al. |
| 7,818,502 B2 | 10/2010 | Kurokawa |
| 7,882,379 B2 | 2/2011 | Kanakogi |
| 7,929,332 B2 | 4/2011 | Fujita |
| 2004/0141363 A1 | 7/2004 | Ohtsuka et al. |
| 2004/0184340 A1 | 9/2004 | Dwarkadas et al. |
| 2005/0146915 A1 | 7/2005 | Koide |
| 2005/0146947 A1* | 7/2005 | Higeta et al. ............. 365/189.07 |
| 2006/0262633 A1 | 11/2006 | Ramaraju et al. |
| 2008/0315286 A1 | 12/2008 | Ieda |
| 2009/0077319 A1 | 3/2009 | Kurokawa |
| 2011/0101351 A1 | 5/2011 | Yamazaki |
| 2011/0121878 A1 | 5/2011 | Kato et al. |
| 2011/0122670 A1 | 5/2011 | Yamazaki et al. |
| 2011/0128777 A1 | 6/2011 | Yamazaki et al. |
| 2011/0134683 A1 | 6/2011 | Yamazaki et al. |
| 2011/0148463 A1 | 6/2011 | Kato et al. |
| 2011/0156025 A1 | 6/2011 | Shionoiri et al. |
| 2011/0176357 A1 | 7/2011 | Koyama et al. |
| 2011/0187410 A1 | 8/2011 | Kato et al. |
| 2011/0228602 A1 | 9/2011 | Saito et al. |
| 2011/0284838 A1 | 11/2011 | Saito |
| 2012/0051118 A1 | 3/2012 | Yamazaki et al. |
| 2012/0314513 A1 | 12/2012 | Kurokawa |

FOREIGN PATENT DOCUMENTS

| | | |
|---|---|---|
| JP | 01-233537 A | 9/1989 |
| JP | 01-290051 A | 11/1989 |
| JP | 2000-215104 A | 8/2000 |
| JP | 2004-185576 A | 7/2004 |
| JP | 2005-222677 A | 8/2005 |
| JP | 3768504 B2 | 4/2006 |
| JP | 2007-096055 A | 4/2007 |
| JP | 2007-123861 A | 5/2007 |
| JP | 2008-269751 A | 11/2008 |
| JP | 2008-541333 A | 11/2008 |
| KR | 2005-072676 A | 7/2005 |
| KR | 10-2008-009129 A | 1/2008 |
| WO | 03/085741 A1 | 10/2003 |
| WO | 2006/127117 A2 | 11/2006 |

OTHER PUBLICATIONS

David A. Patterson et al.; "Cache Performance"; Computer Architecture a Quantitative Approach, Edition, 2nd Edition; 1996; pp. 384-386; Morgan Kaufmnn Publishers.

John L. Hennessy et al.; "Cache Performance Review"; Computer Architecture a Quantitative Approach, 3rd Edition; 2003; pp. 393-395; Morgan Kaufmnn Publishers.

International Search Report (International Patent Application No. PCT/JP2012/003476) dated Aug. 28, 2012.

Written Opinion (International Patent Application No. PCT/JP2012/003476) dated Aug. 28, 2012.

* cited by examiner

600(a) 601(a)

600(a) 601(a) 602(a)

603(a)

600(a) 601(a) 602(a)

603(a)
605a(a)    605b(a)

600(a) 601(a) 602(a)

606(a)  608(a)
              603(a)
605a(a)          605b(a)

600(a) 601(a) 602(a)

FIG. 10A
FIG. 10B
FIG. 10C
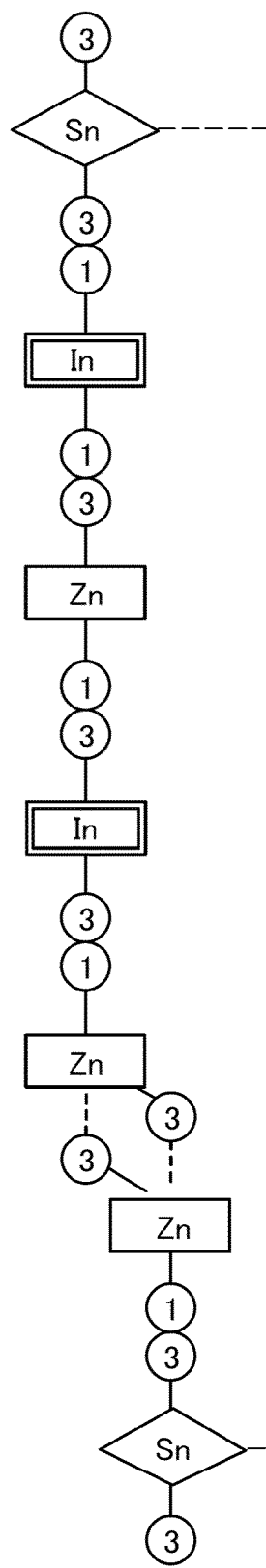
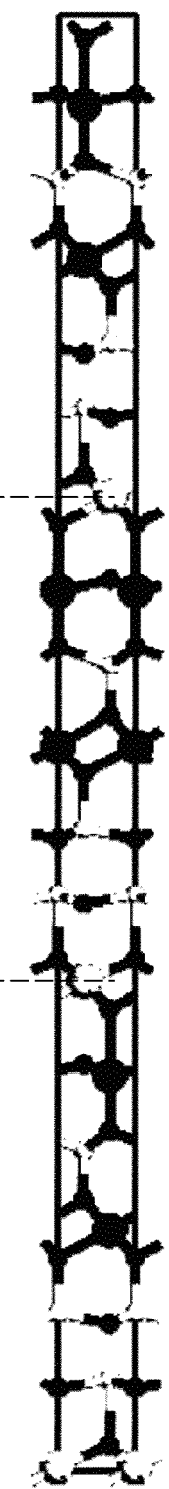
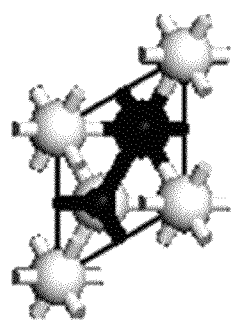
● In
◐ Sn
◞ Zn
• O

- In
- Ga
- Zn
- O

- In
- Ga or Zn
- O

- In
- Ga
- Zn
- O

CACHE MEMORY AND METHOD FOR DRIVING THE SAME

TECHNICAL FIELD

The present invention relates to a cache memory and a method for driving the cache memory.

BACKGROUND ART

Central processing units (CPUs) are generally mounted with a cache memory for temporarily storing data. A cache memory is a memory capable of high-speed operation which copies and stores part of the content of data in a low-speed main memory. When data required by the CPU is stored in the cache memory, the CPU can perform arithmetic processing at high speed.

Here, a state where data required by the CPU is stored in the cache memory is called a cache hit, and a state where the data is not stored in the cache memory is called a cache miss. In the case of a cache miss, the CPU fetches the required data from the low-speed main memory.

Typical structures of a cache memory are a fully associative structure, a direct mapped structure, a set associative structure, and the like.

An n-way set associative cache memory uses n memory sets. Each memory set includes one comparison circuit and m lines which are assigned to lower-order bits of an address of a main memory. Each line includes a tag field for storing higher-order bits of the address of the main memory and a data field for storing data corresponding to the address. Each line is also referred to as a unit of data control in the memory set.

In addition, a control portion for controlling the operation of the cache memory is provided in the cache memory. The control portion can select a specific line of a specific set in the cache memory and read data stored in the line or store data in the line.

A method for storing a piece of data, which is specified by an address, in the cache memory is described. The control portion refers to lower-order bits of the address, and selects one of the lines (n lines in total) corresponding to the lower-order bits in the respective memory sets, as a candidate storage location.

In the case where a least recently used (LRU) mode is used as a rewriting algorithm for the cache memory, the line which has not been used for the longest time of the n lines is determined as the storage location and data in the line is overwritten with the piece of data. Specifically, higher-order bits of the address are stored in the tag field, and a copy of data in the main memory is stored in the data field.

Next, a method by which the cache memory outputs data is described. When the CPU fetches data specified by an address from the control portion provided in the cache memory, the control portion selects the line corresponding to the lower-order bits of the address in each of the n memory sets. Then, the comparison circuit provided in each memory set compares the higher-order bits of the address with the higher-order bits stored in the tag field, and outputs the data stored in the data field of that line to the CPU when the higher-order bits match each other (a cache hit). On the other hand, when the higher-order bits of the address do not match the higher-order bits stored in the tag field in all the n lines (a cache miss), the CPU fetches data from the main memory.

In recent years, a metal oxide having semiconductor characteristics, which is called an oxide semiconductor exhibiting high mobility and uniform element characteristics, has attracted attention as a material of a transistor. Metal oxides are used for a variety of applications. For example, indium oxide is used as a material of a pixel electrode in a liquid crystal display device. Examples of such metal oxides showing semiconductor characteristics include tungsten oxide, tin oxide, indium oxide, and zinc oxide, and transistors in each of which a channel is formed using such a metal oxide showing semiconductor characteristics have been known (Patent Documents 1 and 2).

REFERENCE

Patent Document

[Patent Document 1] Japanese Published Patent Application No. 2007-123861
[Patent Document 2] Japanese Published Patent Application No. 2007-096055

DISCLOSURE OF INVENTION

In the above n-way set associative cache memory, the cache hit rate is increased as the number of memory sets included in the cache memory is increased, which results in improvement of the processing speed of the CPU. Meanwhile, when reading is performed in all the n sets in one reading operation, a cache hit occurs in one of the sets at most, so that power used for reading in the other (n−1) sets is wasted.

In addition, since one memory set necessarily includes one comparison circuit, an increase in the number of memory sets included in the cache memory leads to an increase in circuit size.

The present invention is made in view of the foregoing technical background. Thus, an object of one embodiment of the present invention is to provide a cache memory which can operate with less power consumption and has an improved cache hit rate and a method for driving the cache memory.

In order to achieve the above object, the present invention focuses on a structure of a memory cell. Two data storage portions (a first storage portion and a second storage portion) and one data transfer portion are provided in one memory cell capable of storing 1-bit data, and data can be transferred between the two storage portions via the data transfer portion. One of the two data storage portions can store data input from the outside and output data to the outside.

Specifically, the first storage portion can store 1-bit data and can output the data as read data. Further, the first storage portion can store data input from the outside (e.g., a CPU). The data transfer portion can temporarily store data which is stored in the first storage portion. Further, the data transfer portion can transfer the stored data to the second storage portion. The second storage portion can store 1-bit data and can transfer the data to the first storage portion.

With this structure, the memory cell according to one embodiment of the present invention can store two pieces of data, and can output one of the two pieces of data as read data by storing the data in the first storage portion.

A cache memory according to one embodiment of the present invention includes a memory set including a plurality of lines each including a plurality of memory cells, a comparison circuit paired with the memory set, and a control portion. Each of the memory cells includes a first storage portion, a second storage portion, and a data transfer portion. The first storage portion can store 1-bit data input from the control portion, output stored 1-bit data to the comparison circuit, and transfer stored 1-bit data to the data transfer portion. The data transfer portion can store 1-bit data transferred from the first storage portion and transfer (or transmit) stored 1-bit data to the second storage portion. The second storage portion can store 1-bit data transferred from the data transfer portion and transfer stored 1-bit data to the first storage portion. The memory set can select one of the lines specified by the control portion and store 1-bit data input from the control portion in each of the first storage portions of the memory cells included in the line (or the memory cells forming the line). The memory set can also select one of the lines specified by the control portion and output a data group output from the first storage portions of the respective memory cells included in the line to the comparison circuit. The comparison circuit detects whether address data included in the data group output from the memory set matches address data input from a CPU. When the address data do not match each other, the second storage portion transfers stored 1-bit data to the first storage portion in each of the memory cells included in the line which has output the data group, and the memory set outputs a data group output from the first storage portions of the respective memory cells where data transfer has been performed to the comparison circuit.

The cache memory according to the above embodiment of the present invention includes the memory cell capable of storing two pieces of data in the memory set paired with one comparison circuit. Accordingly, the two pieces of data output from the memory cell are transmitted to the one comparison circuit. Therefore, the amount of data which can be stored can be increased without an increase in the number of comparison circuits.

First data stored in the first storage portion is read first, and only when the first data does not match required data, second data stored in the second storage portion is transferred to the first storage portion and reading is performed again. Thus, reading operation is not performed when the first data that is read first matches the required data, so that the frequency of reading operations can be reduced as compared to that in a conventional cache memory. As a result, the cache memory can operate with less power consumption.

In another embodiment of the present invention, the first storage portion is connected to the data transfer portion through a first transistor, the data transfer portion is connected to the second storage portion through a second transistor, and the second storage portion is connected to the first storage portion through a third transistor in the above cache memory. The first storage portion transfers 1-bit data to the data transfer portion when the first transistor is on, and the data transfer portion holds the data when the first transistor is off. The data transfer portion transfers 1-bit data to the second storage portion when the second transistor is on, and the second storage portion holds the data when the second transistor is off. The second storage portion transfers 1-bit data to the first storage portion when the third transistor is on.

Thus connecting each two of the first storage portion, the second storage portion, and the data transfer portion included in the memory cell in the cache memory through one transistor facilitates data transfer operation and also greatly simplifies the circuit configuration.

In another embodiment of the present invention, the first storage portion includes an inverter loop in which two inverters are connected to each other to form a ring, the data transfer portion includes a first capacitor having a pair of electrodes one of which is grounded, and the second storage portion includes a second capacitor having a pair of electrodes one of which is grounded in the aforementioned cache memory. The first storage portion is connected to the data transfer portion through a first transistor connected in series between one node of the inverter loop and the other electrode of the first capacitor. The data transfer portion is connected to the second storage portion through a second transistor connected in series between the other electrode of the first capacitor and the other electrode of the second capacitor. The second storage portion is connected to the first storage portion through an inverter and a third transistor connected in series between the other electrode of the second capacitor and the other node of the inverter loop. Here, the first storage portion transfers 1-bit data to the data transfer portion when the first transistor is on, and the data transfer portion holds the data when the first transistor is off. The data transfer portion transfers 1-bit data to the second storage portion when the second transistor is on, and the second storage portion holds the data when the second transistor is off. Further, the second storage portion transfers 1-bit data to the first storage portion when the third transistor is on.

The use of the inverter loop including two inverters as the first storage portion which inputs and outputs data enables high-speed operation of the first storage portion, thereby providing a cache memory capable of reading and writing data at high speed. Further, constituting each of the second storage portion and the data transfer portion with one capacitor can greatly simplify the circuit configuration of the memory cell.

In another embodiment of the present invention, a leakage current in an off state per micrometer of a channel width of each of the first transistor and the second transistor in the above cache memory is lower than or equal to $1 \times 10^{-18}$ A.

The use of a transistor having extremely small leakage current in an off state for the transistors which are directly connected to the data transfer portion and the second storage portion each constituted with a capacitor enables data stored in the data transfer portion and the second storage portion to be held for a long period.

An example of such a transistor having extremely small leakage current in an off state is a field-effect transistor in which a semiconductor whose bandgap is wider than that of silicon is used for a semiconductor layer where a channel is formed.

In another embodiment of the present invention, the first transistor and the second transistor in the aforementioned cache memory each include a semiconductor layer in which a channel is formed and which contains an oxide semiconductor.

As described above, an oxide semiconductor is preferably used as the semiconductor included in the transistor. An oxide semiconductor having extremely low intrinsic carrier density is further preferably used. Since the intrinsic carrier density of the semiconductor layer where the channel is formed is extremely low, the leakage current of the transistor in an off state is extremely small. Such a feature is unique to an oxide semiconductor and other semiconductors (e.g., silicon) do not have such a feature.

A method for driving a cache memory according to one embodiment of the present invention includes the following steps. First, a memory set including a plurality of lines each including a plurality of memory cells each having a first storage portion and a second storage portion selects one of the lines specified by a control portion and outputs a first data group output from the first storage portions of the respective memory cells included in the line to a comparison circuit. Then, the comparison circuit detects whether address data included in the first data group output from the memory set matches address data input from a CPU. The comparison circuit outputs a cache hit signal and main data included in the first data group output from the memory set to the CPU when the address data match each other. On the other hand, when the address data do not match each other, the second storage portion transfers stored data to the first storage portion in each of the memory cells included in the line which has output the first data group, and the memory set outputs a second data group output from the first storage portions of the respective memory cells where data transfer has been performed to the comparison circuit.

Using such a driving method, the frequency of reading operations can be reduced as compared to that in a conventional cache memory. As a result, the cache memory can be driven with less power consumption.

An example is given below to explain that the use of a cache memory according to one embodiment of the present invention and a method for driving the cache memory can reduce power consumption as compared to using a conventional cache memory.

Expected cache hit rates and power consumption of a conventional cache memory including 8 memory sets and a cache memory according to one embodiment of the present invention including 4 memory sets are described as an example. As described above, the memory cell of the cache memory according to one embodiment of the present invention can store twice as much data as that of the conventional cache memory; thus, these two cache memories can store the same amount of data.

Here, the probability of a cache hit occurring in one reading operation of the cache memory is denoted by a cache hit rate P, the power used for reading of the cache memory is denoted by total power consumption W, and power consumed by each memory set in one reading operation is denoted by power consumption Ws.

In each cache memory, required data is stored in one line in one of the memory sets. Accordingly, in the conventional cache memory including 8 memory sets, the required data is stored in one of the sets. Meanwhile, in the cache memory according to one embodiment of the present invention including 4 memory sets, the required data is stored in either of the storage portions (the first storage portions or the second storage portions) of a memory cell group included in one line in one of the memory sets.

Since the required data is stored in one of the sets in the conventional cache memory including 8 memory sets, the expected cache hit rate P in one reading operation is 1. Reading is performed in all the 8 memory sets in one reading operation; thus, the total power consumption W is 8 Ws.

Meanwhile, in the cache memory according to one embodiment of the present invention, data stored in the first storage portions of the memory cells is read in the first reading operation in each memory set. When a cache hit does not occur in the first reading operation, data stored in the second storage portions of the memory cells is transferred to the first storage portions, and the second reading operation is performed. Thus, a cache hit rate P1 in the first reading operation is 0.5, and a cache hit rate P2 in the second reading operation (the probability that a cache hit does not occur in the first reading operation and occurs in the second reading operation) is also 0.5. As a result, the cache hit rate P is 1.

The expected power consumption W consumed in reading operation is the sum of power consumption W1 in the case where a cache hit occurs in the first reading operation and power consumption W2 in the case where a cache hit does not occur in the first reading operation and a cache hit occurs in the second reading operation. That is, the power consumption W1 is P1×4 Ws=2 Ws, and the power consumption W2 is P2×8 Ws=4 Ws. As a result, the total power consumption W in the reading operation of the cache memory is 6 Ws.

As described above, an increase in cache hit rate equivalent to that obtained by increasing the number of memory sets can be achieved and power consumption in reading operation can be reduced by using a cache memory according to one embodiment of the present invention and a method for driving the cache memory.

According to one embodiment of the present invention, a cache memory which can operate with less power consumption and has an improved cache hit rate and a method for driving the cache memory can be provided.

BRIEF DESCRIPTION OF DRAWINGS

FIGS. 10A to 10C illustrate a crystal structure of an oxide material.

BEST MODE FOR CARRYING OUT THE INVENTION

Figure 1A:
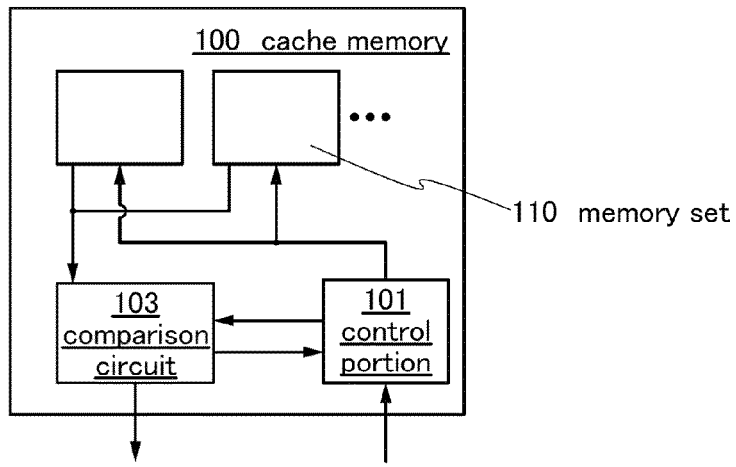
FIGS. 1A to 1C illustrate a cache memory according to one embodiment of the present invention.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

A transistor is a kind of semiconductor elements and can perform amplification of current or voltage, switching operation for controlling conduction or non-conduction, or the like. A transistor in this specification includes an insulated-gate field-effect transistor (IGFET) and a thin film transistor (TFT).

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification and the like, one of a source and a drain of a transistor is referred to as a "first electrode" and the other of the source and the drain of the transistor is referred to as a "second electrode" in some cases. Note that in that case, a gate is also referred to as a "gate" or a "gate electrode".

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric action" include a switching element such as a transistor, a resistor, a coil, a capacitor, and an element with a variety of functions in addition to an electrode and a wiring.

Note that a node in this specification and the like means an element (e.g., a wiring) which enables electric connection between elements included in a circuit. Thus, a "node to which A is connected" refers to a wiring which is electrically connected to A and can be regarded as having the same potential as A. Note that even when one or more elements which enable electrical connection (e.g., switches, transistors, capacitors, inductors, resistors, or diodes) are inserted in a portion of the wiring, the wiring can be regarded as the "node to which A is connected" as long as it has the same potential as A.

Note that in some circuit diagrams described in this specification, "OS" is written beside a transistor in order to indicate that an oxide semiconductor or the like is used as a semiconductor in which a channel is formed in the transistor.

(Embodiment 1)

In this embodiment, a structure of a cache memory according to one embodiment of the present invention and a method for driving the cache memory are described with reference to FIGS. 1A to 1C, FIG. 2, and FIG. 3.

<Structural Example>

FIG. 1A is a block diagram illustrating a structure of a cache memory described as an example in this embodiment. A cache memory 100 includes one or a plurality of memory sets 110, a control portion 101, and a comparison circuit 103. Each memory set 110 is electrically connected to the comparison circuit 103 and the control portion 101. The comparison circuit 103 and the control portion 101 are electrically connected to each other.

The control portion 101 controls the operation of each memory set 110 in response to an input signal from the comparison circuit 103 and a command signal from the outside (e.g., a CPU). For example, the control portion 101 controls reading of data in the memory set 110, rewriting of data in the memory set 110, transfer of data, which is described later, in a memory cell in the memory set 110, and the like.

Required address data is input to the control portion 101 from the outside. The control portion 101 divides the address data into first address data including higher-order bits and second address data including lower-order bits, and outputs the first address data to the comparison circuit 103 and the second address data to each memory set 110.

Further, the control portion 101 can rewrite data in a specific memory set 110 in response to a command signal from the outside. For example, when address data and main data are input from the outside in addition to the rewrite command signal, the control portion 101 selects the memory set 110 whose data is to be rewritten, and requires the memory set 110 to store higher-order bits of the address data (the first address data) and the main data in a line corresponding to lower-order bits of the address data (the second address data).

From each of the memory sets 110, address data and main data respectively stored in a tag field and a data field of a specific line in the memory set 110, which are described later, are input to the comparison circuit 103. The comparison circuit 103 compares the first address data input from the control portion 101 with the address data input from the memory set 110, and outputs a cache hit signal and the main data to the outside when the data match each other. On the other hand, when the data do not match each other in all the memory sets 110, the comparison circuit 103 outputs only a cache miss signal to the control portion 101.

Specifically, the comparison circuit 103 includes tag comparison circuits, the number of which corresponds to that of the memory sets 110 included in the cache memory 100, and one data comparison circuit. The tag comparison circuit is connected to the corresponding memory set 110, and compares the address data output from the memory set with the first address data and outputs the result to the data comparison circuit as a cache hit signal or a cache miss signal. The signal input from each tag comparison circuit and the main data from each memory set 110 are input to the data comparison circuit, and the data comparison circuit outputs a cache hit signal and the main data to the outside or outputs only a cache miss signal to the control portion 101 depending on the signal input from each tag comparison circuit.

Note that the reading operation and the comparison operation are performed concurrently on all the memory sets 110. Such concurrent operation enables the cache memory to operate at higher speed.

Here, when a cache miss signal is input from the comparison circuit 103 to the control portion 101 for the first time, the control portion 101 transmits to the memory sets 110a command signal requiring the memory sets 110 to perform data transfer operation and reading operation which are described later. When a cache miss signal is input to the control portion 101 for the second time, the control portion 101 outputs to the comparison circuit 103a command signal requiring the comparison circuit 103 to output the cache miss signal to the outside. The comparison circuit 103 outputs the cache miss signal to the outside when the command signal is input.

Figure 1B:
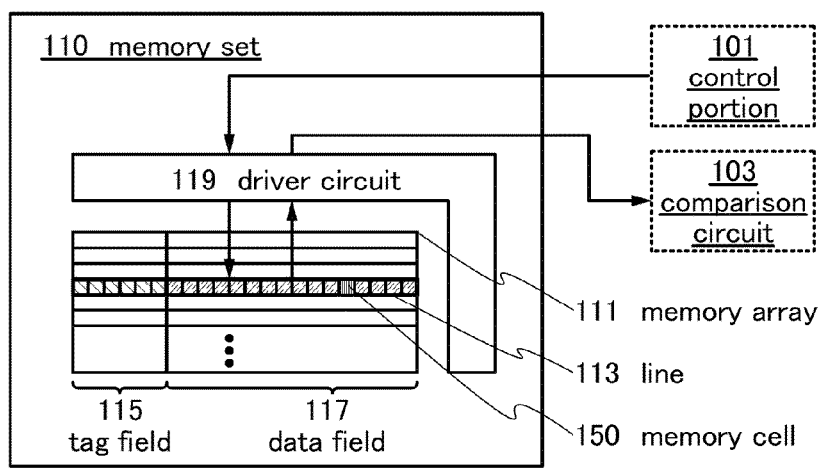

Next, a structure of the memory set 110 is described. FIG. 1B is a block diagram illustrating the structure of the memory set 110. The memory set 110 includes a memory array 111 and a driver circuit 119. The memory array 111 includes m lines 113, each of which includes a plurality of memory cells 150.

The m lines 113 are correspondingly assigned to lower-order bits of address data. Therefore, the line 113 to be selected is uniquely determined by the second address data input from the control portion 101. For example, when 8-bit data is used as the second address data, the memory set 110 includes 256 lines 113.

The lines 113 include at least two regions: a tag field 115 and a data field 117. The tag field 115 stores the first address data, and the data field 117 stores main data corresponding to the address data.

The driver circuit 119 can select the line 113 in the memory array 111, and store (or rewrite) data therein or read data therefrom and output the data to the comparison circuit 103, in response to requirement from the control portion 101. The driver circuit 119 can also perform data transfer operation on the memory cells 150 in the given line 113.

In reading data, the driver circuit 119 selects one line 113 in the memory array 111 which is uniquely determined by the second address data input from the control portion 101, reads data (also referred to as a data group) stored in the line 113, and outputs the data to the comparison circuit 103.

In transferring data, the driver circuit 119 performs data transfer operation described later on all the memory cells 150 included in one specified line 113 in response to a command signal from the control portion 101, and then reads data stored in the line 113 and outputs the data to the comparison circuit 103.

In addition, the driver circuit 119 can rewrite data in a specific line in response to a command signal from the control portion 101. The first address data, the second address data, and the main data are input from the control portion 101 in addition to the rewrite command signal. The driver circuit 119 selects one line 113 in the memory array 111 which is uniquely determined by the second address data, and stores the first address data in the tag field 115 and the main data in the data field 117 in the line 113.

Figure 1C:
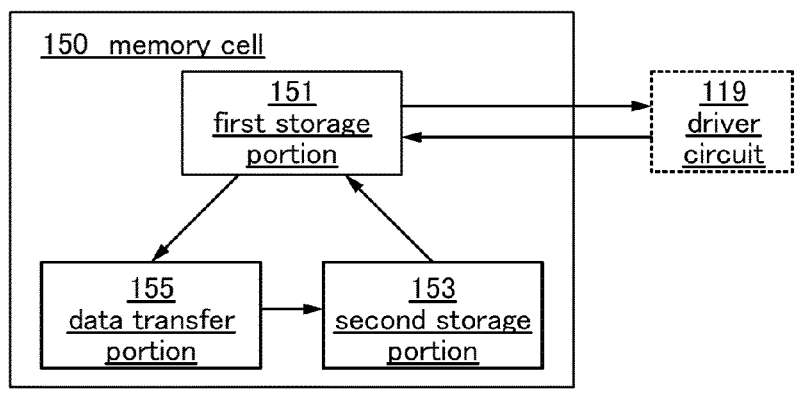

Next, the memory cell 150 is described. FIG. 1C is a block diagram illustrating a structure of the memory cell 150.

The memory cell 150 includes a first storage portion 151, a second storage portion 153, and a data transfer portion 155. The first storage portion 151, the second storage portion 153, and the data transfer portion 155 each can store 1-bit data.

The first storage portion 151 can output the 1-bit data stored therein to the driver circuit 119. The driver circuit 119 can rewrite the data stored in the first storage portion 151. Further, the first storage portion 151 can transfer the 1-bit data stored therein to the data transfer portion 155.

The data transfer portion 155 can store the 1-bit data transferred from the first storage portion 151. Further, the data transfer portion 155 can transfer the 1-bit data stored therein to the second storage portion 153, thereby rewriting data stored in the second storage portion 153.

The second storage portion 153 can store the 1-bit data transferred from the data transfer portion 155. Further, the second storage portion 153 can transfer the 1-bit data stored therein to the first storage portion 151, thereby rewriting data stored in the first storage portion 151.

In this specification and the like, transferring data in a memory cell means to transfer a copy of data stored in a transfer source to a transfer destination. Accordingly, after transfer of data, the same data is stored in the transfer source and the transfer destination.

Here, data transfer operation is described. In an initial state, first data is stored in the first storage portion 151, and second data is stored in the second storage portion 153.

The data transfer operation mainly includes three operations. As the first operation, first data stored in the first storage portion 151 is copied and stored in (transferred to) the data transfer portion 155. Then, as the second operation, second data stored in the second storage portion 153 is transferred to the first storage portion 151. At this time, the second data is stored in each of the first storage portion 151 and the second storage portion 153, and the first data is stored in the data transfer portion 155. Lastly, as the third operation, the first data is transferred to the second storage portion 153 from the data transfer portion 155; thus, the data transfer operation is completed. As a result, the second data is stored in the first storage portion 151 and the first data is stored in the second storage portion 153, i.e., data stored in the first storage portion 151 and the second storage portion 153 in the initial state are replaced with each other.

The above is the description of the structure of the cache memory 100.

<Example Of Connection Structure>

Figure 2:
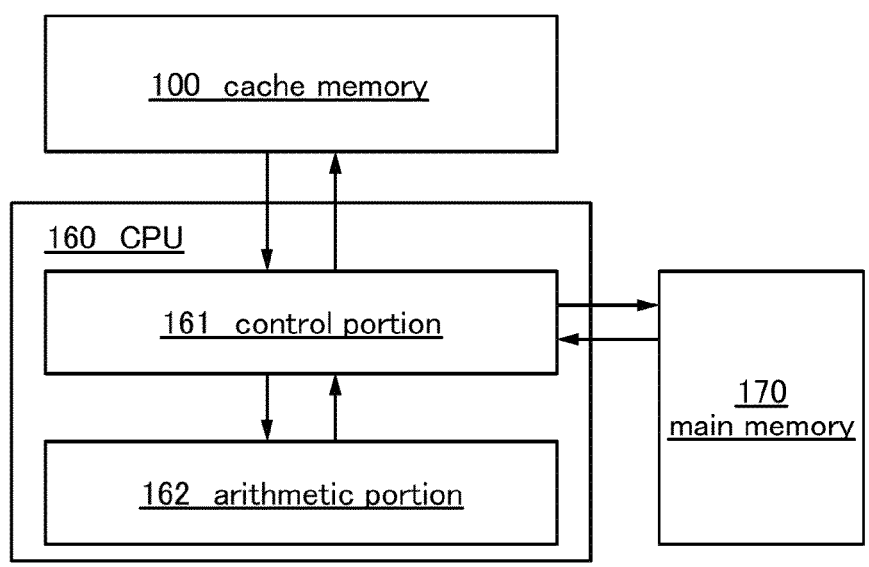
FIG. 2 illustrates a connection structure of a cache memory according to one embodiment of the present invention.

Here, the cache memory 100 according to one embodiment of the present invention can be connected to a CPU at least including an arithmetic portion and a control portion. FIG. 2 is a block diagram illustrating a structure of a CPU 160 to which the cache memory 100 is connected and which includes a control portion 161 and an arithmetic portion 162.

The arithmetic portion 162 performs arithmetic processing such as logic operation and address operation. In order to fetch main data necessary for operation from the control portion 161, the arithmetic portion 162 outputs address data corresponding to the required main data to the control portion 161.

When the address data is input from the arithmetic portion 162, the control portion 161 outputs the address data to the cache memory 100 to require data. At this time, when the control portion 161 receives a cache hit signal and the required main data from the cache memory 100, the control portion 161 outputs the data to the arithmetic portion 162. On the other hand, when the control portion 161 receives a cache miss signal from the cache memory 100, the control portion 161 fetches data from the main memory 170.

When the control portion 161 receives main data from the main memory 170, the control portion 161 outputs the main data to the arithmetic portion 162 and also commands the cache memory 100 to store the main data. At this time, the control portion 161 transmits a write command signal, the main data, and address data corresponding to the main data to the cache memory 100. The cache memory 100 stores the main data and the address data in a specific line of a specific set in response to the write command signal. Note that the control portion 161 may first store the main data and the address data in the cache memory 100 and then read the main data stored in the cache memory 100 and transmit the main data to the arithmetic portion 162, after receiving the main data from the main memory 170.

As the main memory 170, a volatile storage device including an SRAM or a DRAM, or a nonvolatile storage device such as a magneto-optical disk or a flash memory can be used, for example. Hereinafter, in order to distinguish between a cache memory and a main memory, the storage device from which the CPU fetches data first is referred to as a cache memory and the storage device from which the CPU fetches data later is referred to as a main memory.

<Operation Example>

Figure 3:
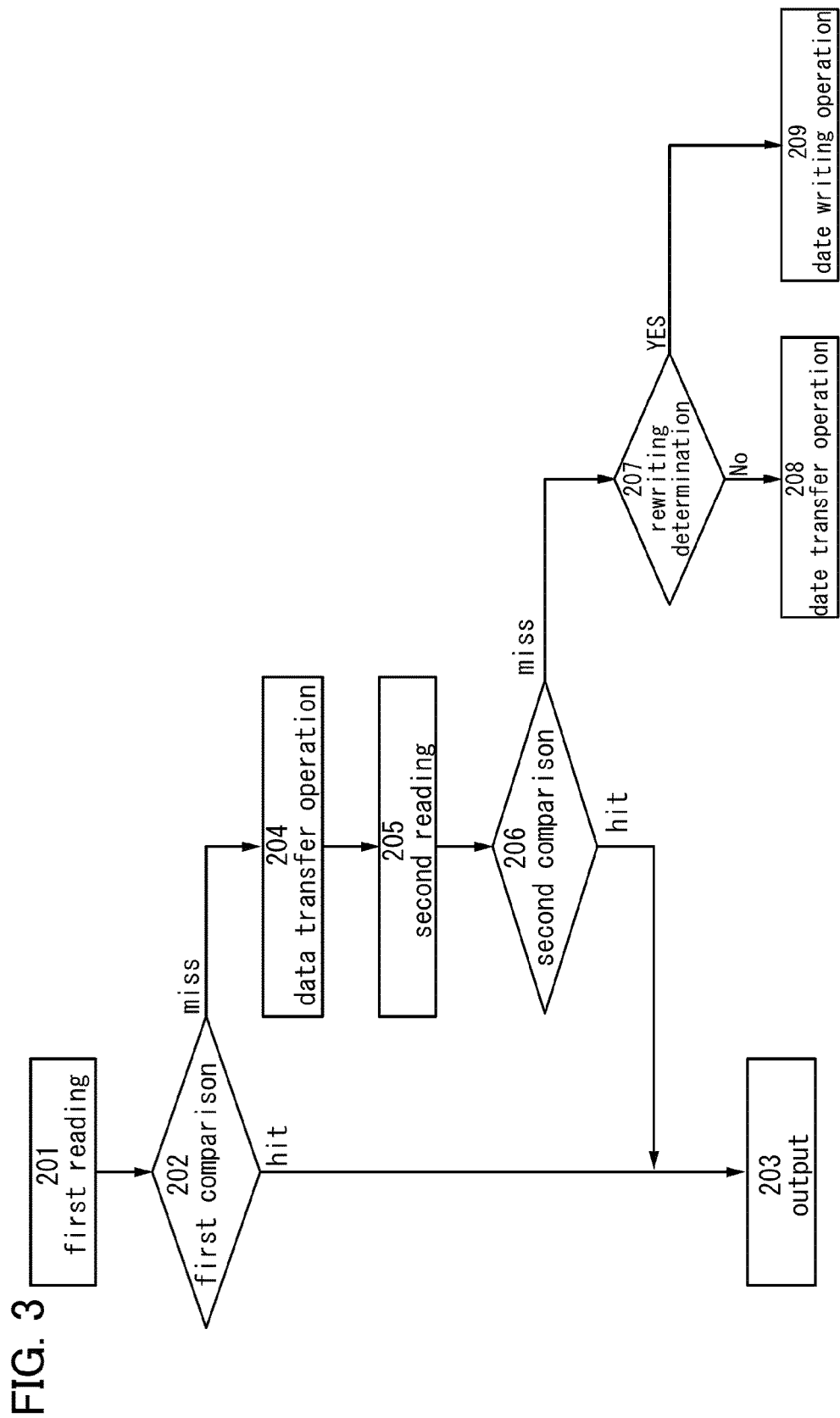
FIG. 3 illustrates operation of a cache memory according to one embodiment of the present invention.

Next, an operation example of the cache memory 100 is described with reference to FIG. 3. FIG. 3 is a flow chart showing an example of the operation of the cache memory 100.

Here, in an initial state, first data is stored in the first storage portion 151 and second data is stored in the second storage portion 153 in each of the memory cells 150.

First, in a step 201 (first reading), required address data is input to the control portion 101; from the control portion 101, second address data is output to each memory set 110 and first address data is output to the comparison circuit 103. Each memory set 110 performs reading of address data and main data stored in the line 113 uniquely determined by the second address data, and outputs the address data and the main data to the comparison circuit 103. The data read here is the first data stored in the first storage portion 151 in each memory cell 150.

In a step 202 (first comparison), the comparison circuit 103 compares the first address data with the address data input from each memory set 110.

Here, when the address data input from any of the memory sets 110 matches the first address data (a cache hit), the comparison circuit 103 outputs a cache hit signal to the outside together with the main data input from the memory set, in a step 203 (outputting).

When none of the address data input from the memory sets 110 matches the first address data (a cache miss) in the step 202, the comparison circuit 103 outputs a cache miss signal to the control portion 101.

When receiving the cache miss signal from the comparison circuit 103 in the step 202, the control portion 101 transmits a data transfer command signal to each memory set 110.

In a step 204 (data transfer operation), the above-described data transfer operation is performed in all the memory cells 150 in the line 113 corresponding to the second address data in each memory set 110. Specifically, the first operation in which first data stored in the first storage portion 151 is transferred to and stored in the data transfer portion 155, the second operation in which second data stored in the second storage portion 153 is transferred to and rewritten in the first storage portion 151, and the third operation in which the first data stored in the data transfer portion 155 is transferred to and rewritten in the second storage portion 153 are performed in this order in the memory cell 150.

Next, in a step 205 (second reading), reading operation is performed again on the line 113 where data transfer operation has been performed in the step 204 in each memory set 110, and the read data is output to the comparison circuit 103. The data read here is the second data stored in the first storage portion 151 in each memory cell 150.

Note that the reading operation in the step 205 is preferably performed concurrently with the third operation in the step 204. Such concurrent operation enables the cache memory to operate at higher speed.

Then, in a step 206 (second comparison), the comparison circuit 103 compares the first address data with the address data input from each memory set 110.

When a cache hit occurs in any of the memory sets 110 in the step 206, the comparison circuit 103 outputs a cache hit signal to the outside together with the main data input from the memory set, in the step 203.

Here, the memory set 110 where a cache hit occurs keeps its state, and in the other memory sets 110 where a cache hit does not occur, operation goes on to a step 207.

On the other hand, when a cache hit does not occur in any of the memory sets 110 (a cache miss) in the step 206, the comparison circuit 103 transmits a cache miss signal to the control portion 101. Then, the comparison circuit 103 outputs a cache miss signal to the outside in response to a command from the control portion 101, and the operation of the memory sets 110 goes on to the step 207.

In the step 207 (rewriting determination), it is determined whether the data in each memory set 110 should be rewritten. In the case where the comparison circuit 103 has transmitted a cache miss signal to the outside in the step 206, one of the memory sets 110 is selected and new data (third data) obtained from the main memory 170 is rewritten therein. As a method for selecting the memory set 110 whose data is to be rewritten, a rewriting algorithm such as the above-described LRU method, a least frequency used (LFU) method in which a memory set least frequently used is selected, or a first in first out (FIFO) method in which a memory set that has stored data first is selected can be used.

Data transfer operation is performed again in a step 208 in the memory set 110 where it has been determined in the step 207 that data should not be rewritten. In the memory set 110 where it has been determined that data should be rewritten, operation goes on to a step 209.

In the step 208 (data transfer operation), the above data transfer operation is performed again. As a result, a state in which the first data is stored in the first storage portion 151 and the second data is stored in the second storage portion 153, that is, the initial state is obtained in the memory cell 150.

In the step 209 (date writing operation), address data, a rewrite command signal, and a data group including third data to be input to each memory cell are input to the control portion 101. Then, the third data is written to all the memory cells 150 in the line 113 in the memory set 110 where it has been determined in the step 207 that data should be rewritten. In each memory cell 150, the third data is written in the first storage portion 151. Thus, in the memory cell 150 where data has been written, the third data is stored in the first storage portion 151 and the first data is stored in the second storage portion 153.

The above is the description of the operation of the cache memory 100 according to one embodiment of the present invention.

In this manner, two pieces of data can be stored in the memory cell 150 in the cache memory 100, so that a cache hit rate equivalent to that in the case where the number of memory sets is doubled can be achieved. Further, an increase in circuit size can be suppressed as compared to the case of increasing the number of memory sets because the number of comparison circuits is not increased. The above-described operation of the cache memory 100 including the memory cell 150 can reduce the power used for reading operation as compared to the case of doubling the number of memory sets.

This embodiment can be combined with any of the other embodiments disclosed in this specification as appropriate.

(Embodiment 2)

In this embodiment, a specific configuration example of the memory cell 150 described in Embodiment 1 and the operation thereof are described with reference to FIG. 4 and FIG. 5.

<Configuration Example>

Figure 4:
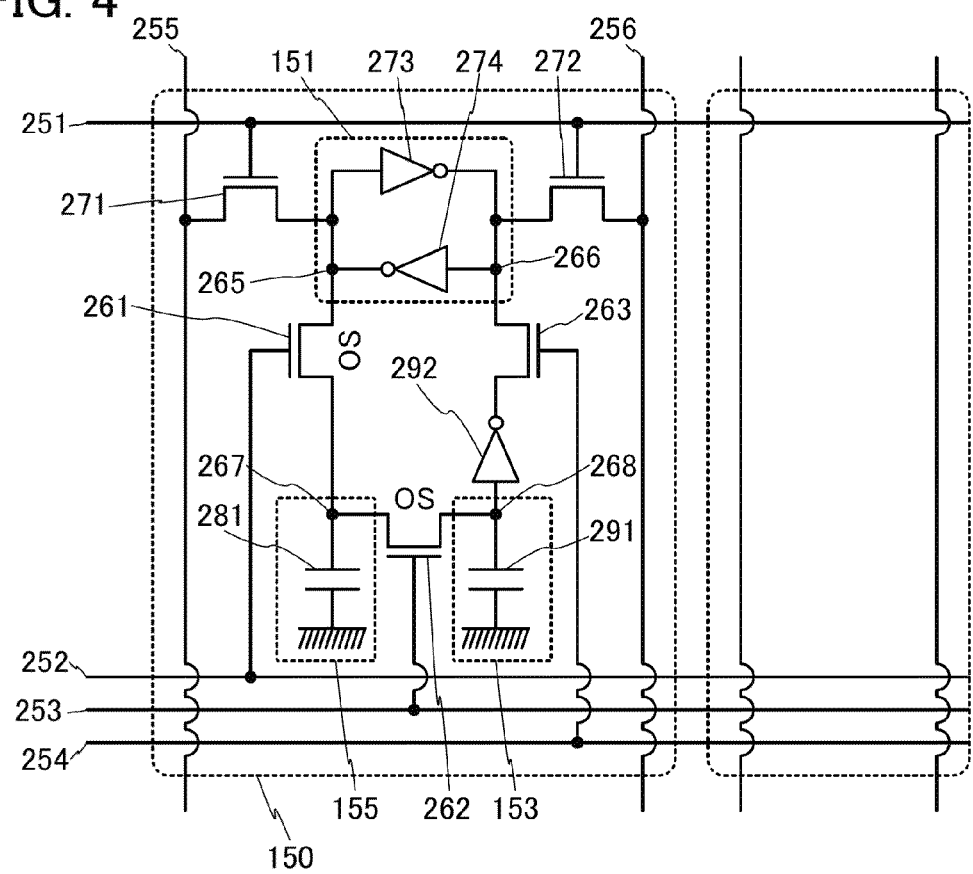
FIG. 4 illustrates a memory cell of a cache memory according to one embodiment of the present invention.

FIG. 4 illustrates a configuration example of the memory cell 150 described as an example in this embodiment. The memory cell 150 includes a transistor 261, a transistor 262, a transistor 263, a transistor 271, a transistor 272, an inverter 273, an inverter 274, a capacitor 281, a capacitor 291, and an inverter 292. A first gate line 251, a second gate line 252, a third gate line 253, a fourth gate line 254, a first bit line 255, and a second bit line 256 are connected to the memory cell 150.

Here, the transistor 261, the transistor 262, the transistor 263, the transistor 271, and the transistor 272 are all n-channel transistors. The inverter 273, the inverter 274, and the inverter 292 may have any structure as long as they have a function of inverting the phase of an input potential and outputting the inverted potential. For example, each inverter may include an n-channel transistor and a p-channel transistor in combination or may include only either of an n-channel transistor or a p-channel transistor.

A gate of the transistor 271 is connected to the first gate line 251, a first electrode of the transistor 271 is connected to the first bit line 255, and a second electrode of the transistor 271 is connected to an input terminal of the inverter 273, an output terminal of the inverter 274, and a first electrode of the transistor 261. A gate of the transistor 272 is connected to the first gate line 251, a first electrode of the transistor 272 is connected to an output terminal of the inverter 273, an input terminal of the inverter 274, and a first electrode of the transistor 263, and a second electrode of the transistor 272 is connected to the second bit line 256. The inverter 273 and the inverter 274 are connected to each other to form a ring, thereby forming an inverter loop. Here, the inverter loop corresponds to the first storage portion 151 described in Embodiment 1. A node to which the second electrode of the transistor 271 is connected is a node 265, and a node to which the first electrode of the transistor 272 is connected is a node 266.

A gate of the transistor 261 is connected to the second gate line 252, and a second electrode of the transistor 261 is connected to one electrode of the capacitor 281 and a first electrode of the transistor 262. The other electrode of the capacitor 281 is grounded. Here, a region including a node 267 between the second electrode of the transistor 261 and the one electrode of the capacitor 281 and the capacitor 281 corresponds to the data transfer portion 155 described in Embodiment 1. The data transfer portion 155 stores data by holding a potential in the capacitor 281.

A gate of the transistor 262 is connected to the third gate line 253, and a second electrode of the transistor 262 is connected to one electrode of the capacitor 291 and an input terminal of the inverter 292. The other electrode of the capacitor 291 is grounded. An output terminal of the inverter 292 is connected to a second electrode of the transistor 263. A gate of the transistor 263 is connected to the fourth gate line 254. Here, a region including a node 268 between the capacitor 291 and the inverter 292 and the capacitor 291 corresponds to the second storage portion 153 described in Embodiment 1. The second storage portion 153 stores data by holding a potential in the capacitor 291.

In the memory cell 150, data stored in the first storage portion 151 can be output via the first bit line 255 and the second bit line 256, and data in the first storage portion 151 can be rewritten. The data stored in the first storage portion 151 can be copied to and stored in the data transfer portion 155 via the transistor 261. The data stored in the data transfer portion 155 can be stored in the second storage portion 153 via the transistor 262, so that data in the second storage portion 153 is rewritten. The data stored in the second storage portion 153 can be stored in the first storage portion 151 via the transistor 263, so that data in the first storage portion 151 is rewritten.

Here, in the case of transferring the data stored in the data transfer portion 155 to the second storage portion 153, specifically, the transistor 262 is turned on to electrically connect the node 267 to the node 268, whereby the potential of the node 268 is made close to the potential of the node 267 at the time right before the transistor 262 is turned on. Accordingly, the capacitor 281 in the data transfer portion 155 has sufficiently larger capacitance than the capacitor 291 in the second storage portion 153. For example, the capacitor 281 preferably has at least twice as large capacitance as the capacitor 291.

A transistor capable of high-speed operation which includes crystalline silicon or the like as a semiconductor in which a channel is formed can be applied to the transistor 271, the transistor 272, and transistors constituting the inverter 273, the inverter 274, and the inverter 292. The use of such a transistor capable of high-speed operation enables high-speed writing and reading to and from the memory cell 150.

A transistor having extremely small leakage current in an off state is preferably applied to the transistor 261 and the transistor 262. For example, a field-effect transistor in which a semiconductor whose bandgap is wider than that of silicon is used for a semiconductor layer in which a channel is formed can be used. For example, a semiconductor whose bandgap is 2 eV or more, preferably 2.5 eV or more, more preferably 3.0 eV or more can be used. Such a transistor has small leakage current in an off state. An oxide semiconductor is preferably used as such a semiconductor.

In addition, an oxide semiconductor having extremely low intrinsic carrier density is preferably used as a semiconductor included in the transistor. Since the intrinsic carrier density of the semiconductor layer where the channel is formed is extremely low, the leakage current of the transistor in an off state is extremely small. Such a feature is unique to an oxide semiconductor and other semiconductors (e.g., silicon) do not have such a feature.

The transistor including the oxide semiconductor has a small leakage current (hereinafter also referred to as an off-state current) in an off state. The off-state current per micrometer of channel width is lower than or equal to 10 aA ($1\times10^{-17}$ A), preferably lower than or equal to 1 aA ($1\times10^{-18}$ A), more preferably lower than or equal to 10 zA ($1\times10^{-20}$ A), further preferably lower than or equal to 1 zA ($1\times10^{-21}$ A), still further preferably lower than or equal to 100 yA ($1\times10^{-22}$ A).

The transistor 263 can be a transistor capable of high-speed operation like the transistor 271 and the like or can be a transistor having extremely small leakage current in an off state like the transistor 261 and the like.

In this embodiment, the data transfer portion 155 and the second storage portion 153 each store data by accumulating charge in the capacitor; however, the structure of the memory cell 150 is not limited thereto. For example, an inverter loop may be used as each of the data transfer portion 155 and the second storage portion 153, and data stored therein may be transferred via a switching element such as a transistor or an analog switch. However, with the structure of the memory cell 150 described as an example in this embodiment, the number of transistors included in the memory cell can be significantly reduced, resulting in a simplified structure. In addition, as described in a later embodiment, the transistor capable of high-speed operation applied to the transistor 271 and the like and the transistor having extremely small leakage current in an off state applied to the transistor 261 and the like are stacked, whereby the area occupied by the memory cell 150 can be reduced.

<Example Of Circuit Operation>

An example of circuit operation of the memory cell 150 described in this embodiment is described below with reference to FIG. 5. FIG. 5 is a timing chart of circuit operation of the memory cell 150.

Figure 5:
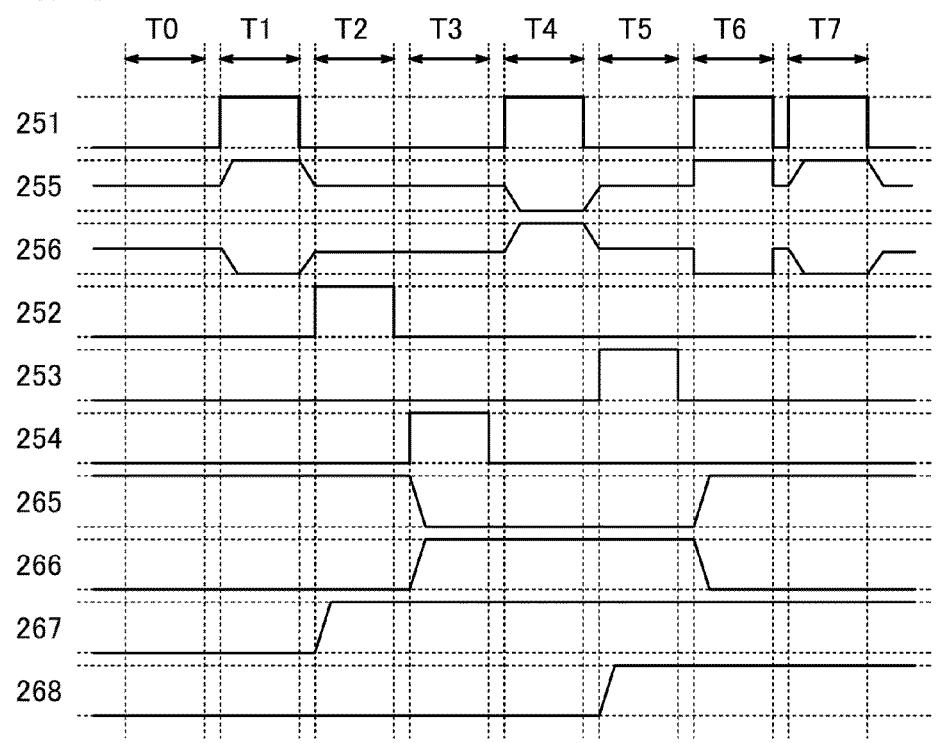
FIG. 5 illustrates an operation of a memory cell of a cache memory according to one embodiment of the present invention.

The timing chart in FIG. 5 shows the change over time in the potential of the first gate line 251, the first bit line 255, the second bit line 256, the second gate line 252, the third gate line 253, the fourth gate line 254, the node 265, the node 266, the node 267, and the node 268, in the order starting from the top.

A period T0 represents an initial state. Here, in the initial state, a high-level potential is applied to the node 265 and a low-level potential is applied to the node 266 in the first storage portion 151. In the initial state, a low-level potential is applied to the node 267 in the data transfer portion 155 and the node 268 in the second storage portion 153. The first bit line 255 and the second bit line 256 are supplied with an intermediate potential to be precharged.

A period T1 represents first reading operation. In reading, a high-level potential is applied only to the first gate line 251. At this time, the transistor 271 and the transistor 272 whose gates are connected to the first gate line 251 are turned on, so that the node 265 is electrically connected to the first bit line 255, and the node 266 is electrically connected the second bit line 256. Thus, a high-level potential is output to the first bit line 255, and a low-level potential is output to the second bit line 256. These potential changes are detected by a sense amplifier or the like in the driver circuit 119, whereby reading can be performed.

A period T2 represents data transfer operation from the first storage portion 151 to the data transfer portion 155. At this time, a high-level potential is applied to the second gate line 252, so that the transistor 261 is turned on, and the node 265 is electrically connected to the node 267. In addition, charge corresponding to the potential of the node 267 is accumulated in the capacitor 281, whereby a high-level potential is stored in the data transfer portion 155.

After the period T2, a low-level potential is applied to the second gate line 252, so that the transistor 261 is turned off. At this time, the transistor 262 is kept in an off state. Here, the transistor 261 and the transistor 262 have extremely small leakage current in an off state as described above, so that leakage of the charge accumulated in the capacitor 281 is significantly suppressed; thus, the potential of the node 267 can be held for an extremely long period.

A period T3 represents operation of rewriting data stored in the first storage portion 151 with data from the second storage portion 153. At this time, a high-level potential is applied to the fourth gate line 254, so that the transistor 263 is turned on. Thus, a potential obtained by inversion of the potential of the node 268 by the inverter 292 is applied to the node 266. Here, since the node 268 has a low-level potential, an inverted potential thereof, i.e., a high-level potential is applied to the node 266. In response to this, the potential of the node 265 is inverted from a high-level potential to a low-level potential. In this manner, data in the first storage portion 151 can be rewritten with data in the second storage portion 153.

A period T4 represents second reading operation. Similarly to the period T1, reading is performed by applying a high-level potential to the first gate line 251. Here, a low-level potential is output to the first bit line 255, and a high-level potential is output to the second bit line 256.

A period T5 represents data transfer operation from the data transfer portion 155 to the second storage portion 153. At this time, a high-level potential is applied to the third gate line 253, so that the transistor 262 is turned on, and the node 267 is electrically connected to the node 268. Here, the capacitor 281 has sufficiently larger capacitance than the capacitor 291 as described above, so that the potential of the node 268 is made close to that of the node 267 at the time right before the transistor 262 is turned on. In this manner, data can be transferred from the data transfer portion 155 to the second storage portion 153. Actually, the potential of the capacitor 291 also changes because charge is exchanged between the capacitor 291 and the capacitor 281, but FIG. 5 does not show this potential change for simplicity.

After the period T5, a low-level potential is applied to the third gate line 253, so that the transistor 262 is turned off. Since the transistor 262 has extremely small leakage current in an off state as described above, leakage of the charge accumulated in the capacitor 291 is significantly suppressed; thus, the potential of the node 268 can be held for an extremely long period.

A period T6 represents operation of writing data to the first storage portion 151. Here, the case of writing a high-level potential to the node 265 and a low-level potential to the node 266 in the first storage portion 151 is described. At this time, a high-level potential is applied to the first gate line 251, a high-level potential is applied to the first bit line 255, and a low-level potential is applied to the second bit line 256. Accordingly, a high-level potential is applied to the node 265 from the first bit line 255 via the transistor 271, and a low-level potential is applied to the node 266 from the second bit line 256 via the transistor 272. In this manner, data can be written to the first storage portion 151.

A period T7 represents third reading operation. Similarly to the period T1, reading is performed by applying a high-level potential to the first gate line 251. Here, a high-level potential is output to the first bit line 255, and a low-level potential is output to the second bit line 256.

The above is the description of the operation of the memory cell 150.

The memory cell 150 is applied to the cache memory 100 in Embodiment 1, whereby a cache hit rate equivalent to that obtained by increasing the number of memory sets can be achieved and a cache memory capable of operation with less power consumption can be provided.

The use of a transistor having extremely small leakage current in an off state as the transistor connecting the first storage portion 151 and the data transfer portion 155 and the transistor connecting the data transfer portion 155 and the second storage portion 153 in the memory cell 150 enables the data stored in the data transfer portion 155 and the second storage portion 153 to be held for an extremely long period.

This embodiment can be combined with any of the other embodiments disclosed in this specification as appropriate.

(Embodiment 3)

In this embodiment, examples of a transistor including an oxide semiconductor layer, which can be used for a cache memory according to one embodiment of the present invention, are described.

Examples of structures of the transistor including the oxide semiconductor layer will be described with reference to FIGS. 6A to 6D. FIGS. 6A to 6D are schematic cross-sectional views each illustrating an example of the structure of the transistor in this embodiment.

Figure 6A:
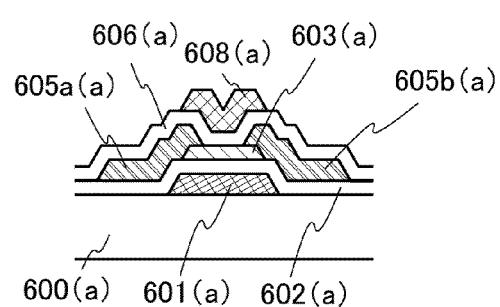
FIGS. 6A to 6D each illustrate a transistor according to one embodiment of the present invention.

The transistor illustrated in FIG. 6A includes a conductive layer 601(a), an insulating layer 602(a), a semiconductor layer 603(a), a conductive layer 605a(a), a conductive layer 605b(a), an insulating layer 606(a), and a conductive layer 608(a).

The conductive layer 601(a) is provided over an element formation layer 600(a).

The insulating layer 602(a) is provided over the conductive layer 601(a).

The semiconductor layer 603(a) overlaps with the conductive layer 601(a) with the insulating layer 602(a) provided therebetween.

The conductive layer 605a(a) and the conductive layer 605b(a) are each provided over the semiconductor layer 603(a) and electrically connected to the semiconductor layer 603(a).

The insulating layer 606(a) is provided over the semiconductor layer 603(a), the conductive layer 605a(a), and the conductive layer 605b(a).

The conductive layer 608(a) overlaps with the semiconductor layer 603(a) with the insulating layer 606(a) provided therebetween.

Note that one of the conductive layer 601(a) and the conductive layer 608(a) is not necessarily provided. When the conductive layer 608(a) is not provided, the insulating layer 606(a) is not necessarily provided.

Figure 6B:
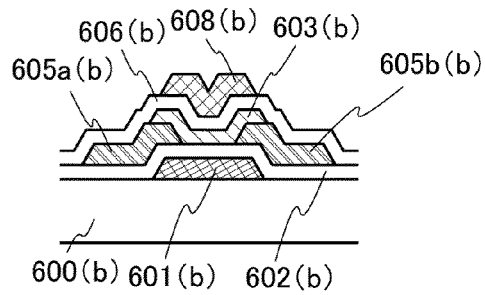

The transistor illustrated in FIG. 6B includes a conductive layer 601(b), an insulating layer 602(b), a semiconductor layer 603(b), a conductive layer 605a(b), a conductive layer 605b(b), an insulating layer 606(b), and a conductive layer 608(b).

The conductive layer 601(b) is provided over an element formation layer 600(b).

The insulating layer 602(*b*) is provided over the conductive layer 601(*b*).

The conductive layer 605*a*(b) and the conductive layer 605*b*(b) are each provided over part of the insulating layer 602(*b*).

The semiconductor layer 603(*b*) is provided over the conductive layer 605*a*(b) and the conductive layer 605*b*(b) and electrically connected to the conductive layer 605*a*(b) and the conductive layer 605*b*(b). Further, the semiconductor layer 603(*b*) overlaps with the conductive layer 601(*b*) with the insulating layer 602(*b*) provided therebetween.

The insulating layer 606(*b*) is provided over the semiconductor layer 603(*b*), the conductive layer 605*a*(b), and the conductive layer 605*b*(b).

The conductive layer 608(*b*) overlaps with the semiconductor layer 603(*b*) with the insulating layer 606(*b*) provided therebetween.

Note that one of the conductive layer 601(*b*) and the conductive layer 608(*b*) is not necessarily provided. When the conductive layer 608(*b*) is not provided, the insulating layer 606(*b*) is not necessarily provided.

Figure 6C:
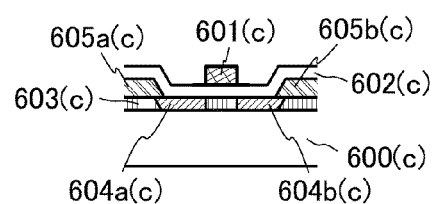

The transistor illustrated in FIG. 6C includes a conductive layer 601(*c*), an insulating layer 602(*c*), a semiconductor layer 603(*c*), a conductive layer 605*a*(c), and a conductive layer 605*b*(c).

The semiconductor layer 603(*c*) includes a region 604*a*(c) and a region 604*b*(c). The region 604*a*(c) and the region 604*b*(c) are provided apart from each other, and are regions to which a dopant is added. A region between the region 604*a*(c) and the region 604*b*(c) serves as a channel formation region. The semiconductor layer 603(*c*) is provided over an element formation layer 600(*c*). Note that it is not necessary to provide the region 604*a*(c) and the region 604*b*(c).

The conductive layer 605*a*(c) and the conductive layer 605*b*(c) are provided over the semiconductor layer 603(*c*) and electrically connected to the semiconductor layer 603(*c*). The sides of the conductive layer 605*a*(c) and the conductive layer 605*b*(c) are tapered.

The conductive layer 605*a*(c) overlaps with part of the region 604*a*(c); however, this embodiment is not limited thereto. When the conductive layer 605*a*(c) overlaps with part of the region 604*a*(c), resistance between the conductive layer 605*a*(c) and the region 604*a*(c) can be low. An entire region of the semiconductor layer 603(*c*) which overlaps with the conductive layer 605*a*(c) may be the region 604*a*(c).

The conductive layer 605*b*(c) overlaps with part of the region 604*b*(c); however, this embodiment is not limited thereto. When the conductive layer 605*b*(c) overlaps with part of the region 604*b*(c), resistance between the conductive layer 605*b*(c) and the region 604*b*(c) can be low. An entire region of the semiconductor layer 603(*c*) which overlaps with the conductive layer 605*b*(c) may be the region 604*b*(c).

The insulating layer 602(*c*) is provided over the semiconductor layer 603(*c*), the conductive layer 605*a*(c), and the conductive layer 605*b*(c).

The conductive layer 601(*c*) overlaps with the semiconductor layer 603(*c*) with the insulating layer 602(*c*) provided therebetween. A region in the semiconductor layer 603(*c*), which overlaps with the conductive layer 601(*c*) with the insulating layer 602(*c*) provided therebetween serves as the channel formation region.

Figure 6D:
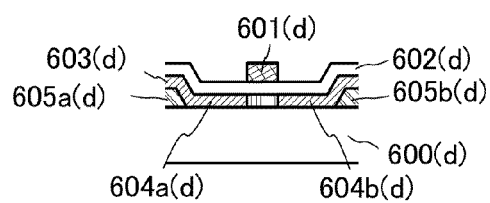

The transistor illustrated in FIG. 6D includes a conductive layer 601(*d*), an insulating layer 602(*d*), a semiconductor layer 603(*d*), a conductive layer 605*a*(d), and a conductive layer 605*b*(d).

The conductive layer 605*a*(d) and the conductive layer 605*b*(d) are provided over an element formation layer 600(*d*). The sides of the conductive layer 605*a*(d) and the conductive layer 605*b*(d) are tapered.

The semiconductor layer 603(*d*) includes a region 604*a*(d) and a region 604*b*(d). The region 604*a*(d) and the region 604*b*(d) are provided apart from each other, and are regions to which a dopant is added. A region between the region 604*a*(d) and the region 604*b*(d) serves as a channel formation region. For example, the semiconductor layer 603(*d*) is provided over the conductive layer 605*a*(d), the conductive layer 605*b*(d), and the element formation layer 600(*d*), and is electrically connected to the conductive layer 605*a*(d) and the conductive layer 605*b*(d). Note that it is not necessary to provide the region 604*a*(d) and the region 604*b*(d).

The region 604*a*(d) is electrically connected to the conductive layer 605*a*(d).

The region 604*b*(d) is electrically connected to the conductive layer 605*b*(d).

The insulating layer 602(*d*) is provided over the semiconductor layer 603(*d*).

The conductive layer 601(*d*) overlaps with the semiconductor layer 603(*d*) with the insulating layer 602(*d*) provided therebetween. A region in the semiconductor layer 603(*d*), which overlaps with the conductive layer 601(*d*) with the insulating layer 602(*d*) provided therebetween serves as the channel formation region.

The components illustrated in FIGS. 6A to 6D will be described below.

The element formation layers 600(*a*) to 600(*d*) can be insulating layers, substrates having insulating surfaces, or the like, for example. Further, layers over which elements are formed in advance can be used as the element formation layers 600(*a*) to 600(*d*).

The conductive layers 601(*a*) to 601(*d*) each function as a gate of the transistor. Note that a layer functioning as a gate of the transistor can be called a gate electrode or a gate wiring.

As the conductive layers 601(*a*) to 601(*d*), it is possible to use, for example, a layer of a metal material such as molybdenum, magnesium, titanium, chromium, tantalum, tungsten, aluminum, copper, neodymium, or scandium or an alloy material containing any of these materials as a main component. The conductive layers 601(*a*) to 601(*d*) can also be formed by stacking layers of materials which can be applied to the conductive layers 601(*a*) to 601(*d*).

The insulating layers 602(*a*) to 602(*d*) each function as a gate insulating layer of the transistor.

Each of the insulating layers 602(*a*) to 602(*d*) can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. The insulating layers 602(*a*) to 602(*d*) can also be formed by stacking layers of materials which can be applied to the insulating layers 602(*a*) to 602(*d*).

Alternatively, as each of the insulating layers 602(*a*) to 602(*d*), an insulating layer of a material containing an element that belongs to Group 13 of the periodic table and oxygen can be used, for example. For example, when the semiconductor layers 603(*a*) to 603(*d*) contain a Group 13 element, the use of insulating layers containing a Group 13 element as insulating layers in contact with the semiconductor layers 603(*a*) to 603(*d*) makes the state of interfaces between the insulating layers and the oxide semiconductor layers favorable.

Examples of the material containing a Group 13 element and oxygen include gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. For example, it is possible to use a material represented by $Al_2O_x$ ($x=3+\alpha$, where $\alpha$ is larger than 0 and smaller than 1), $Ga_2O_x$ ($x=3+\alpha$, where $\alpha$ is larger than 0 and smaller than 1), or $Ga_xAl_{2-x}O_{3+\alpha}$, (x is larger than 0 and smaller than 2 and $\alpha$ is larger than 0 and smaller than 1).

The insulating layers 602(*a*) to 602(*d*) can also be formed by stacking layers of materials which can be applied to the insulating layers 602(*a*) to 602(*d*). For example, each of the insulating layers 602(*a*) to 602(*d*) may be formed using a stack of a plurality of layers containing gallium oxide represented by $Ga_2O_x$. Alternatively, each of the insulating layers 602(*a*) to 602(*d*) may be formed using a stack of an insulating layer containing gallium oxide represented by $Ga_2O_x$ and an insulating layer containing aluminum oxide represented by $Al_2O_x$.

The semiconductor layers 603(*a*) to 603(*d*) each function as a layer in which a channel of the transistor is formed. As an oxide semiconductor that can be used for the semiconductor layers 603(*a*) to 603(*d*), a metal oxide such as a four-component metal oxide, a three-component metal oxide, or a two-component metal oxide can be used, for example.

An oxide semiconductor to be used preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

Examples of a four-component metal oxide include an In—Sn—Ga—Zn—O-based oxide, an In—Sn—Al—Zn—O-based oxide, an In—Sn—Hf—Zn—O-based oxide, and an In—Hf—Al—Zn—O-based oxide.

Examples of a three-component metal oxide include an In—Ga—Zn—O-based oxide, an In—Sn—Zn—O-based oxide, an In—Al—Zn—O-based oxide, Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, and an In—Lu—Zn—O-based oxide.

Examples of a two-component metal oxide include an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, an In—Sn—O-based oxide, and an In—Ga—O-based oxide.

In addition, an In—O-based oxide, a Sn—O-based oxide, a Zn—O-based oxide, or the like can also be used as the oxide semiconductor. The metal oxide that can be used as the oxide semiconductor may contain silicon oxide.

For example, an In—Ga—Zn—O-based oxide with an atomic ratio of In:Ga:Zn=1:1:1 or In:Ga:Zn=2:2:1, or an oxide with an atomic ratio close to the above atomic ratios can be used for the oxide semiconductor layer. Alternatively, an In—Sn—Zn—O-based oxide with an atomic ratio of In:Sn:Zn=1:1:1, In:Sn:Zn=2:1:3, or In:Sn:Zn=2:1:5, or an oxide with an atomic ratio close to the above atomic ratios is preferably used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier density, the impurity concentration, the defect density, the atomic ratio between a metal element and oxygen, the interatomic distance, the density, and the like be set to appropriate values.

As the oxide semiconductor, a material represented by $InLO_3(ZnO)_m$ (m is larger than 0) can be used. Here, L in $InLO_3(ZnO)_m$ represents one or more metal elements selected from Ga, Al, Mn, and Co.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

At least a region of each of the semiconductor layers 603(*a*) to 603(*d*), in which the channel is formed may be crystalline and non-single-crystal and may include a phase which has a triangular, hexagonal, regular triangular, or regular hexagonal atomic arrangement when seen from the direction perpendicular to the a-b plane and in which metal atoms are arranged in a layered manner in the direction perpendicular to the c-axis direction or the metal atoms and oxygen atoms are arranged in a layered manner in the direction perpendicular to the c-axis direction. A material including the phase is also referred to as a c-axis aligned crystalline oxide semiconductor (CAAC-OS).

A transistor including a crystalline oxide semiconductor can be a highly reliable transistor in which degradation of a transistor due to stress (degradation due to gate bias stress or the like) and changes in electric characteristics of a transistor due to irradiation with visible light or ultraviolet light are inhibited.

Further, when the channel length of the transistor is 30 nm, the thickness of each of the semiconductor layers 603(*a*) to 603(*d*) may be approximately 5 nm, for example. In that case, a short-channel effect can be prevented in the transistor when each of the semiconductor layers 603(a) to 603(d) is formed using a CAAC-OS film.

The CAAC-OS film will be described in detail in Embodiment 5.

A dopant imparting n-type or p-type conductivity is added to each of the regions 604a(c), 604b(c), 604a(d), and 604b(d), and the regions 604a(c), 604b(c), 604a(d), and 604b(d) each function as a source or a drain of the transistor. As the dopant, one or more of elements of Group 13 in the periodic table (e.g., boron) and elements of Group 15 in the periodic table (e.g., nitrogen, phosphorus, and arsenic) can be used. A region functioning as a source of a transistor is also referred to as a source region, and a region functioning as a drain of a transistor is also referred to as a drain region. When the dopant is added to each of the regions 604a(c), 604b(c), 604a(d), and 604b(d), connection resistance between the region and the conductive layer can be reduced, so that the transistor can be miniaturized.

The conductive layers 605a(a) to 605a(d) and the conductive layers 605b(a) to 605b(d) each function as a source or a drain of the transistor. Note that a layer functioning as a source of a transistor is also referred to as a source electrode or a source wiring, and a layer functioning as a drain of a transistor is also referred to as a drain electrode or a drain wiring.

Each of the conductive layers 605a(a) to 605a(d) and the conductive layers 605b(a) to 605b(d) can be, for example, a layer of a metal material such as aluminum, magnesium, chromium, copper, tantalum, titanium, molybdenum, or tungsten; or an alloy material which contains any of the above metal materials as a main component. For example, each of the conductive layers 605a(a) to 605a(d) and the conductive layers 605b(a) to 605b(d) can be formed using a layer of an alloy material containing copper, magnesium, and aluminum. Alternatively, each of the conductive layers 605a(a) to 605a(d) and the conductive layers 605b(a) to 605b(d) can be formed using a stack of layers of materials that can be used for the conductive layers 605a(a) to 605a(d) and the conductive layers 605b(a) to 605b(d). For example, each of the conductive layers 605a(a) to 605a(d) and the conductive layers 605b(a) to 605b(d) can be formed using a stack of a layer of an alloy material containing copper, magnesium, and aluminum and a layer containing copper.

Alternatively, each of the conductive layers 605a(a) to 605a(d) and the conductive layers 605b(a) to 605b(d) can be a layer containing a conductive metal oxide. Examples of the conductive metal oxide include indium oxide, tin oxide, zinc oxide, indium oxide-tin oxide, and indium oxide-zinc oxide. Note that silicon oxide may be contained in the conductive metal oxide that can be used for the conductive layers 605a(a) to 605a(d) and the conductive layers 605b(a) to 605b(d).

Each of the insulating layers 606(a) and 606(b) can be a layer of a material that can be used for the insulating layers 602(a) to 602(d). Alternatively, each of the insulating layers 606(a) and 606(b) can be formed using a stack of materials that can be used for the insulating layers 606(a) and 606(b). For example, each of the insulating layers 606(a) and 606(b) may be a silicon oxide layer, an aluminum oxide layer, or the like. For example, the use of an aluminum oxide layer as the insulating layers 606(a) and 606(b) can more effectively prevent impurities from entering the semiconductor layers 603(a) and 603(b) and effectively prevent the semiconductor layers 603(a) and 603(b) from releasing oxygen.

The conductive layers 608(a) and 608(b) each function as a gate of the transistor. Note that when the transistor includes both of the conductive layers 601(a) and 608(a) or both of the conductive layers 601(b) and 608(b), one of the conductive layers 601(a) and 608(a) or one of the conductive layers 601(b) and 608(b) is also referred to as a back gate, a back gate electrode, or a back gate wiring. When a plurality of conductive layers each functioning as a gate are provided with a channel formation layer provided therebetween, the threshold voltage of the transistor can be easily controlled.

Each of the conductive layers 608(a) and 608(b) can be a layer of a material that can be used for the conductive layers 601(a) to 601(d), for example. Alternatively, each of the conductive layers 608(a) and 608(b) may be formed using a stack of layers of materials that can be used for the conductive layers 608(a) and 608(b).

Note that the transistor in this embodiment may have a structure in which an insulating layer is provided over part of the oxide semiconductor layer serving as a channel formation layer and a conductive layer serving as a source or a drain is provided to overlap with the oxide semiconductor layer with the insulating layer placed therebetween. In that case, the insulating layer functions as a layer protecting the channel formation layer of the transistor (also referred to as channel protective layer). As the insulating layer functioning as a channel protective layer, a layer of a material that can be used for the insulating layers 602(a) to 602(d) can be used, for example. Alternatively, an insulating layer functioning as a channel protective layer may be formed using a stack of materials that can be used for the insulating layers 602(a) to 602(d).

In addition, base layers may be formed over the element formation layers 600(a) to 600(d) and the transistors may be formed over the base layers. In that case, a layer of a material that can be used for the insulating layers 602(a) to 602(d) can be used as the base layer, for example. Alternatively, the base layer may be formed using a stack of materials that can be used for the insulating layers 602(a) to 602(d). For example, when the base layer is formed using a stack of an aluminum oxide layer and a silicon oxide layer, elimination of oxygen included in the base layer through the semiconductor layers 603(a) to 603(d) can be inhibited.

Next, as an example of a method for manufacturing the transistor in this embodiment, an example of a method for manufacturing the transistor in FIG. 6A will be described below with reference to FIGS. 7A to 7E. FIGS. 7A to 7E are schematic cross-sectional views illustrating an example of a method for manufacturing the transistor in FIG. 6A.

Figure 7A:
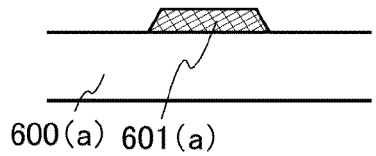
FIGS. 7A to 7E illustrate a method for manufacturing a transistor according to one embodiment of the present invention.

First, as illustrated in FIG. 7A, the element formation layer 600(a) is prepared and a first conductive film is formed over the element formation layer 600(a). Part of the first conductive film is etched, so that the conductive layer 601(a) is formed.

For example, the first conductive film can be formed by formation of a film of a material that can be used for the conductive layer 601(a) by sputtering. Alternatively, the first conductive film can be formed using a stack of films of materials that can be used for the first conductive film.

When a high-purity gas from which impurities such as hydrogen, water, a hydroxyl group, or hydride are removed is used as a sputtering gas, the impurity concentration of the film can be reduced.

Note that before the film is formed by sputtering, preheat treatment may be performed in a preheating chamber of a sputtering apparatus. By the preheat treatment, impurities such as hydrogen or moisture can be eliminated.

Further, before the film is formed by sputtering, for example, treatment in which voltage is applied not to the target side but to the substrate side in an argon atmosphere, a nitrogen atmosphere, a helium atmosphere, or an oxygen atmosphere with the use of RF power and plasma is generated so that a surface where the film is to be formed is modified (such treatment is also referred to as reverse sputtering) may be performed. By reverse sputtering, powdery substances (also referred to as particles or dust) attached to the surface where the film is to be formed can be removed.

In the case where the film is formed by sputtering, moisture remaining in a deposition chamber used for forming the film can be removed with an entrapment vacuum pump or the like. As the entrapment vacuum pump, a cryopump, an ion pump, or a titanium sublimation pump can be used, for example. Alternatively, moisture remaining in the deposition chamber can be removed with a turbo molecular pump provided with a cold trap. With the use of the vacuum pump, backflow of exhaust air including impurities can be reduced.

As in the method for forming the conductive layer 601(*a*), the example of the method for forming the transistor in this embodiment employs, for example, the following steps in order to form a layer by etching of part of a film: a resist mask is formed over part of the film by a photolithography process and the film is etched using the resist mask, so that the layer can be formed. Note that in this case, the resist mask is removed after the layer is formed.

Note that the resist mask may be formed by an inkjet method. A photomask is not needed in an inkjet method; thus, manufacturing cost can be reduced. Alternatively, the resist mask may be formed using a light-exposure mask having a plurality of regions with different transmittances (also referred to as a multi-tone mask). With the multi-tone mask, a resist mask having a plurality of regions with different thicknesses can be formed, so that the number of resist masks used for the formation of the transistor can be reduced.

Figure 7B:
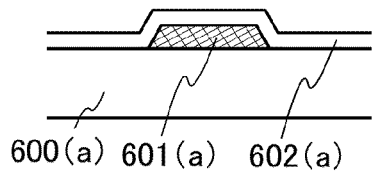

Next, as illustrated in FIG. 7B, the insulating layer 602(*a*) is formed by formation of a first insulating film over the conductive layer 601(*a*).

For example, the first insulating film can be formed by formation of a film of a material that can be used for the insulating layer 602(*a*) by sputtering, plasma-enhanced CVD, or the like. The first insulating film can be formed using a stack of films of materials that can be used for the insulating layer 602(*a*). Further, when the film of a material that can be used for the insulating layer 602(*a*) is formed by high-density plasma-enhanced CVD (e.g., high-density plasma-enhanced CVD using microwaves (e.g., microwaves with a frequency of 2.45 GHz)), the insulating layer 602(*a*) can be dense and can have higher breakdown voltage.

Figure 7C:
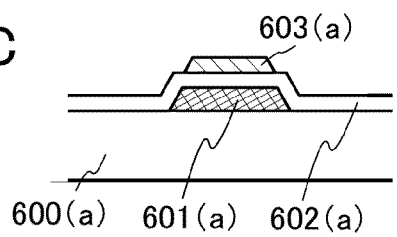

Then, as illustrated in FIG. 7C, an oxide semiconductor film is formed over the insulating layer 602(*a*). After that, part of the oxide semiconductor film is etched so that the semiconductor layer 603(*a*) is formed. The oxide semiconductor film is formed by sputtering, evaporation, PCVD, PLD, ALD, MBE, or the like.

For example, the oxide semiconductor film can be formed by formation of a film of an oxide semiconductor material that can be used for the semiconductor layer 603(*a*) by sputtering. Note that the oxide semiconductor film may be formed in a rare gas atmosphere, an oxygen atmosphere, or a mixed atmosphere of a rare gas and oxygen, and is preferably formed in an oxygen gas atmosphere. The substrate heating temperature in film formation is higher than or equal to 100° C. and lower than or equal to 600° C., preferably higher than or equal to 150° C. and lower than or equal to 550° C., further preferably higher than or equal to 200° C. and lower than or equal to 500° C. The thickness of the oxide semiconductor film is greater than or equal to 1 nm and less than or equal to 40 nm, preferably greater than or equal to 3 nm and less than or equal to 20 nm. At this time, it is preferable that the concentration of impurities such as hydrogen or water in a sputtering apparatus be extremely low. For example, by performing heat treatment before formation of the oxide semiconductor film, the concentration of impurities such as hydrogen or water in the sputtering apparatus can be reduced. In addition, as the substrate heating temperature at the time of film formation is higher, the impurity concentration of the obtained oxide semiconductor film is lower. Further, by heating the substrate at the time of film formation, the atomic arrangement in the oxide semiconductor film is ordered, and the density thereof is increased, so that a polycrystal or a CAAC-OS is readily formed (or formation thereof is promoted) in not only the vicinity of a surface of the oxide semiconductor film but also the whole oxide semiconductor film. Furthermore, when an oxygen gas atmosphere is employed for the deposition, an unnecessary atom such as a rare gas atom is not contained in the oxide semiconductor film, so that a polycrystal or a CAAC-OS is readily formed (or formation thereof is promoted). Note that in the case of using a mixed gas atmosphere including an oxygen gas and a rare gas, the percentage of an oxygen gas is higher than or equal to 30 vol. %, preferably higher than or equal to 50 vol. %, more preferably higher than or equal to 80 vol. %. As the oxide semiconductor film is thinner, the short channel effect of the transistor can be reduced. However, when the oxide semiconductor film is too thin, the oxide semiconductor film is significantly influenced by interface scattering; thus, the field-effect mobility might be decreased.

In the case of forming the oxide semiconductor film by sputtering, the insulating layer 602(*a*) is preferably flat. For example, the average surface roughness of the insulating layer 602(*a*) is preferably less than 0.5 nm, more preferably less than or equal to 0.1 nm.

For example, an oxide target having the following atomic ratio of metal elements can be used as a sputtering target for formation of an oxide semiconductor film: In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, when the atomic ratio of the target used for formation of an In—Zn—O-based oxide semiconductor is expressed by In:Zn:O=S:U:R, R>1.5S+U. An increase in the In content makes the mobility of the transistor higher.

The atomic ratio of metal elements in an oxide semiconductor target used for formation of an In—Sn—Zn—O-based material film by sputtering can be In:Sn:Zn=1:1:1, 2:1:3, 1:2:2, 4:9:7, or the like. When an oxide semiconductor film is formed using an In—Sn—Zn—O target having the aforementioned atomic ratio, a polycrystal or a CAAC-OS is easily formed.

The atomic ratio of metal elements in an oxide semiconductor target used for formation of an In—Ga—Zn—O-based material film by sputtering can be In:Ga:Zn=1:1:1, 4:2:3, 3:1:2, 1:1:2, 2:1:3, 3:1:4, or the like. When an oxide semiconductor film is formed using an In—Ga—Zn—O target having the aforementioned atomic ratio, a polycrystal or a CAAC-OS is easily formed.

Figure 7D:
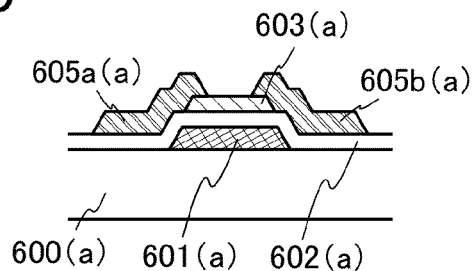

Then, as illustrated in FIG. 7D, a second conductive film is formed over the insulating layer 602(*a*) and the semiconductor layer 603(*a*) and is partly etched so that the conductive layer 605*a*(a) and the conductive layer 605*b*(a) are formed.

For example, the second conductive film can be formed by formation of a film of a material that can be used for the conductive layers 605*a*(a) and 605*b*(a) by sputtering or the like. Alternatively, the second conductive film can be formed using a stack of films of materials that can be used for the conductive layers 605a(a) and 605b(a).

Figure 7E:
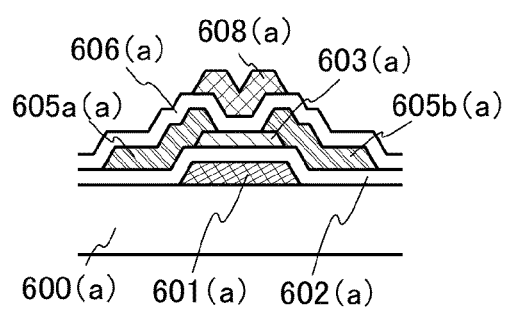

Then, as illustrated in FIG. 7E, the insulating layer 606(a) is formed to be in contact with the semiconductor layer 603(a).

For example, the insulating layer 606(a) can be formed by formation of a film that can be used for the insulating layer 606(a) in a rare gas (typically argon) atmosphere, an oxygen atmosphere, or a mixed atmosphere of a rare gas and oxygen by sputtering. The insulating layer 606(a) formed by sputtering enables suppression of a reduction in resistance of a portion of the semiconductor layer 603(a), which serves as a back channel of the transistor. The temperature of the substrate at the time when the insulating layer 606(a) is formed is preferably higher than or equal to room temperature and lower than or equal to 300° C.

Before the formation of the insulating layer 606(a), plasma treatment using a gas such as $N_2O$, $N_2$, or Ar may be performed so that water or the like adsorbed onto an exposed surface of the semiconductor layer 603(a) is removed. In the case where the plasma treatment is performed, the insulating layer 606(a) is preferably formed after the plasma treatment without exposure to the air.

Further, in the example of the method for manufacturing the transistor in FIG. 6A, heat treatment is performed, for example, at higher than or equal to 600° C. and lower than or equal to 750° C., or higher than or equal to 600° C. and lower than the strain point of the substrate. For example, the heat treatment is performed after the oxide semiconductor film is formed, after part of the oxide semiconductor film is etched, after the second conductive film is formed, after part of the second conductive film is etched, or after the insulating layer 606(a) is formed. The heat treatment is performed in a reduced pressure atmosphere, an inert atmosphere, or an oxidation atmosphere. Especially when the heat treatment is performed with the oxide semiconductor film exposed, the impurity concentration in the oxide semiconductor film can be reduced.

The heat treatment is preferably performed in such a manner that after heat treatment is performed in a reduced pressure atmosphere or an inert atmosphere, the atmosphere is switched to an oxidation atmosphere with the temperature maintained and heat treatment is further performed. When the heat treatment is performed in a reduced pressure atmosphere or an inert atmosphere, the impurity concentration in the oxide semiconductor film can be reduced; however, oxygen vacancies are caused at the same time. By the heat treatment in the oxidation atmosphere, the caused oxygen vacancies can be reduced.

By performing heat treatment in addition to the substrate heating at the time of deposition on the oxide semiconductor film, the impurity levels in the film can be significantly reduced. Accordingly, the field-effect mobility of the transistor can be increased so as to be close to ideal field-effect mobility to be described later.

Note that a heat treatment apparatus for the heat treatment can be an electric furnace or an apparatus for heating an object by heat conduction or heat radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

After the heat treatment, a high-purity oxygen gas, a high-purity $N_2O$ gas, or ultra-dry air (with a dew point of −40° C. or lower, preferably −60° C. or lower) may be introduced into the furnace that has been used in the heat treatment. It is preferable that the oxygen gas or the $N_2O$ gas do not contain water, hydrogen, and the like. The purity of the oxygen gas or the $N_2O$ gas which is introduced into the heat treatment apparatus is preferably 6N or higher, further preferably 7N or higher; that is, the impurity concentration of the oxygen gas or the $N_2O$ gas is preferably 1 ppm or lower, further preferably 0.1 ppm or lower. By the action of the oxygen gas or the $N_2O$ gas, oxygen is supplied to the semiconductor layer 603(a), so that defects caused by oxygen deficiency in the semiconductor layer 603(a) can be reduced. Note that the high-purity oxygen gas, high-purity $N_2O$ gas, or ultra-dry air may be introduced during the heat treatment.

Further, oxygen doping treatment using oxygen plasma may be performed after the formation of the insulating layer 602(a), after the formation of the oxide semiconductor film, after the formation of the conductive layer functioning as a source electrode or a drain electrode, after the formation of the insulating layer over the conductive layer functioning as a source electrode or a drain electrode, or after the heat treatment. For example, oxygen doping treatment using high-density plasma of 2.45 GHz may be performed. Alternatively, oxygen doping treatment may be performed by ion implantation. The oxygen doping treatment can reduce variations in electric characteristics of transistors to be manufactured. For example, the oxygen doping treatment is performed to make either one or both of the insulating layer 602(a) and the insulating layer 606(a) contain oxygen with a higher proportion than that in the stoichiometric composition.

When the insulating layer which is in contact with the semiconductor layer 603(a) contains oxygen excessively, oxygen is easily supplied to the semiconductor layer 603(a). This can reduce oxygen defects in the semiconductor layer 603(a) or at an interface between the semiconductor layer 603(a) and either one or both of the insulating layer 602(a) and the insulating layer 606(a), thereby reducing the carrier concentration of the semiconductor layer 603(a). One embodiment of the present invention is not limited thereto. Even when the semiconductor layer 603(a) is made to excessively contain oxygen through manufacturing steps, the insulating layer in contact with the semiconductor layer 603(a) can suppress a release of oxygen from the semiconductor layer 603(a).

For example, when an insulating layer containing gallium oxide is formed as one or each of the insulating layer 602(a) and the insulating layer 606(a), the composition of the gallium oxide can be set to be $Ga_2O_x$ by supplying the insulating layer with oxygen.

When an insulating layer containing aluminum oxide is formed as one or each of the insulating layer 602(a) and the insulating layer 606(a), the composition of the aluminum oxide can be set to be $Al_2O_x$ by supplying the insulating layer with oxygen.

Further, when an insulating layer containing gallium aluminum oxide or aluminum gallium oxide is formed as one or each of the insulating layer 602(a) and the insulating layer 606(a), the composition of the gallium aluminum oxide or the aluminum gallium oxide can be set to be $Ga_xAl_{2-x}O_{3+a}$ by supplying the insulating layer with oxygen.

Through the above steps, impurities such as hydrogen, water, a hydroxyl group, and hydride (also referred to as a hydrogen compound) are removed from the semiconductor layer 603(a) and oxygen is supplied to the semiconductor layer 603(a); thus, the oxide semiconductor layer can be highly purified.

Further, in addition to the heat treatment, after the insulating layer 606(a) is formed, heat treatment (preferably at higher than or equal to 200° C. and lower than or equal to 600° C., for example, higher than or equal to 250° C. and lower than or equal to 350° C.) may be performed in an inert gas atmosphere or an oxygen gas atmosphere.

As illustrated in FIG. 7E, a third conductive film is formed over the insulating layer 606(a) and is partly etched so that the conductive layer 608(a) is formed.

For example, the third conductive film can be formed by formation of a film of a material that can be used for the conductive layer 608(a) by sputtering. Alternatively, the third conductive film can be formed using a stack of films of materials that can be used for the third conductive film.

Note that although the example of the method for manufacturing the transistor illustrated in FIG. 6A is described, this embodiment is not limited to this. For example, as for the components in FIGS. 6B to 6D that have the same designations as the components in FIG. 6A and whose functions are at least partly the same as those of the components in FIG. 6A, the description of the example of the method for manufacturing the transistor illustrated in FIG. 6A can be referred to as appropriate.

In the case where the regions 604a(c) and 604a(d) and the regions 604b(c) and 604b(d) are formed as illustrated in FIGS. 6C and 6D, the regions 604a(c) and 604a(d) and the regions 604b(c) and 604b(d) are formed in a self-aligned manner through insulating layers functioning as gate insulating layers by addition of dopants to semiconductor layers from sides where conductive layers functioning as gates are formed.

For example, the dopant can be added with the use of an ion doping apparatus or an ion implantation apparatus.

As described with reference to FIGS. 6A to 6D and FIGS. 7A to 7E, the example of the transistor in this embodiment includes a conductive layer functioning as a gate; an insulating layer functioning as a gate insulating layer; an oxide semiconductor layer which has a channel and overlaps with the conductive layer functioning as a gate with the insulating layer functioning as a gate insulating layer provided therebetween; a conductive layer which is electrically connected to the oxide semiconductor layer and functions as one of a source and a drain; and a conductive layer which is electrically connected to the oxide semiconductor layer and functions as the other of the source and the drain.

After formation of the oxide semiconductor film, it is preferable that dehydration treatment (dehydrogenation treatment) be performed to remove hydrogen or moisture from the oxide semiconductor film, so that the oxide semiconductor film is highly purified so as to include as few impurities as possible, and oxygen whose amount is reduced at the same time be added to the oxide semiconductor or excess oxygen be supplied to fill the oxygen vacancies in the oxide semiconductor film by oxygen adding treatment. In this specification and the like, supplying oxygen to an oxide semiconductor film may be expressed as oxygen adding treatment or oxygen supplying treatment.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an electrically i-type (intrinsic) or substantially i-type oxide semiconductor film.

The oxide semiconductor layer in which a channel is formed is an oxide semiconductor layer which is turned into an i-type or substantially i-type semiconductor layer by purification. By purification of the oxide semiconductor layer, the carrier concentration in the oxide semiconductor layer can be lower than $1 \times 10^{14}/cm^3$, preferably lower than $1 \times 10^{12}/cm^3$, more preferably lower than $1 \times 10^{11}/cm^3$.

The transistor including the oxide semiconductor layer which is highly purified by sufficiently reducing the hydrogen concentration, and in which defect levels in the energy gap due to oxygen vacancies are reduced by sufficiently supplying oxygen can achieve excellent off-state current characteristics. For example, the off-state current per micrometer of channel width at room temperature (25° C.) can be lower than or equal to 10 aA/μm ($1 \times 10^{-17}$ A/μm), lower than or equal to 1 aA/μm ($1 \times 10^{-18}$ A/μm), lower than or equal to 10 zA/μm ($1 \times 10^{-20}$ A/μm), further lower than or equal to 1 zA/μm ($1 \times 10^{-21}$ A/μm), and furthermore lower than or equal to 100 yA/μm ($1 \times 10^{-22}$ A/μm). It is preferable that the off-state current of the transistor be as low as possible. The lowest value of the off-state current of the transistor in this embodiment is estimated to be about $10^{-30}$ A/μm.

When the transistor including the oxide semiconductor layer, according to this embodiment is used as a transistor in the memory cell in the above embodiment, for example, the leakage current in an off state of the transistor can be extremely small and a data retention period can be extremely long.

This embodiment can be combined with any of the other embodiments disclosed in this specification as appropriate.

(Embodiment 4)

In this embodiment, an example of a structure of the memory cell in the above embodiment is described.

A memory cell in this embodiment includes a transistor including a semiconductor layer in which a channel is formed and a Group 14 semiconductor of the periodic table (e.g., silicon) is contained and a transistor including an oxide semiconductor layer in which a channel is formed. In this case, the transistor including an oxide semiconductor layer in which a channel is formed can be stacked over the transistor including a semiconductor layer which contains a Group 14 semiconductor of the periodic table (e.g., silicon). The transistor including a semiconductor layer which contains a Group 14 semiconductor of the periodic table (e.g., silicon) can be applied to the transistor 271 and the transistors included in the inverter 273 in FIG. 4, for example.

Figure 8:
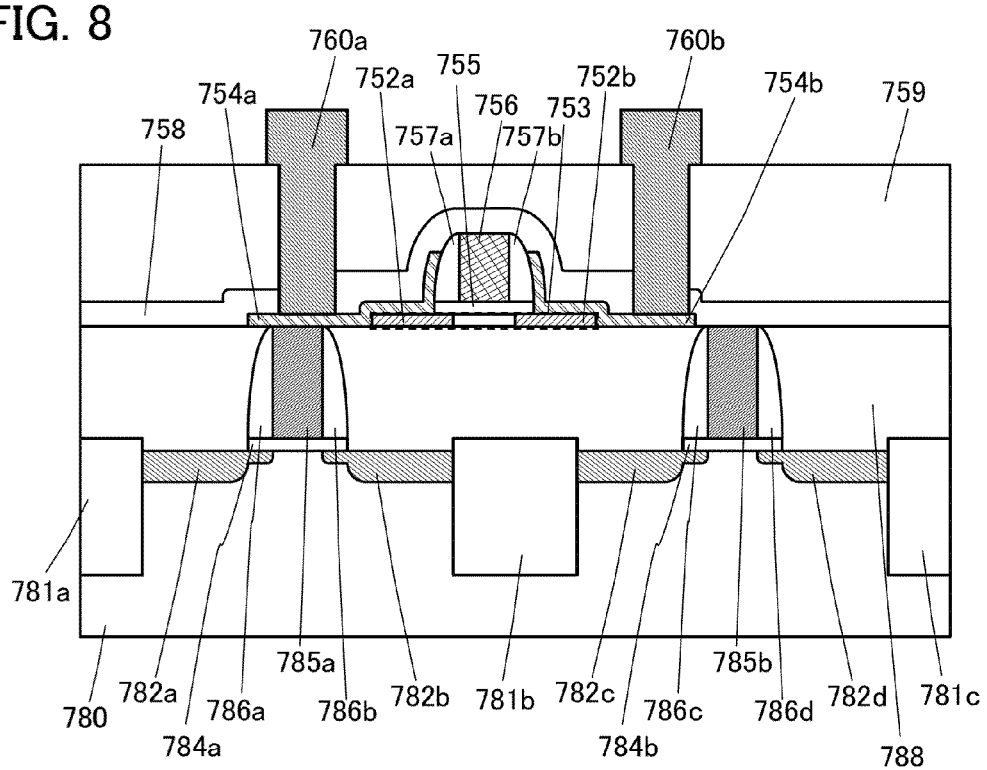
FIG. 8 illustrates a memory cell of a cache memory according to one embodiment of the present invention.

FIG. 8 illustrates an example in which the transistor including an oxide semiconductor layer in which a channel is formed is stacked over the transistor including a semiconductor layer which contains a Group 14 semiconductor of the periodic table (e.g., silicon). Note that the sizes of some components illustrated in FIG. 8 are different from actual sizes.

In FIG. 8, a p-channel transistor and an n-channel transistor (e.g., the transistors included in the inverter 273 in FIG. 4) each including a semiconductor layer which contains a Group 14 semiconductor of the periodic table (e.g., silicon) and a transistor (e.g., the transistor 261 in FIG. 4) including an oxide semiconductor layer in which a channel is formed are formed using a semiconductor layer 780, an insulating layer 784a, an insulating layer 784b, a conductive layer 785a, a conductive layer 785b, an insulating layer 786a, an insulating layer 786b, an insulating layer 786c, an insulating layer 786d, an insulating layer 788, a semiconductor layer 753, a conductive layer 754a, a conductive layer 754b, an insulating layer 755, a conductive layer 756, an insulating layer 757a, an insulating layer 757b, an insulating layer 758, an insulating layer 759, a conductive layer 760a, and a conductive layer 760b.

Further, the semiconductor layer 780 includes a region 782a, a region 782b, a region 782c, and a region 782d. The semiconductor layer 780 is provided with insulating regions 781a to 781c, whereby the transistors are electrically separated from each other.

As the semiconductor layer 780, for example, a semiconductor substrate can be used. Alternatively, a semiconductor layer provided over a different substrate can be used as the semiconductor layer 780.

The region 782a and the region 782b are regions which are separated from each other and to which a dopant imparting p-type conductivity is added. The region 782a and the region 782b function as a source region and a drain region of the p-channel transistor. For example, the region 782a and the region 782b may each be electrically connected to an additionally provided conductive layer.

The region 782c and the region 782d are regions which are separated from each other and to which a dopant imparting n-type conductivity is added. The region 782c and the region 782d function as a source region and a drain region of the n-channel transistor. For example, the region 782c and the region 782d may each be electrically connected to an additionally provided conductive layer.

Note that a low-concentration region may be partly provided in each of the regions 782a to 782d. In that case, the low-concentration regions may be shallower than the rest of the regions 782a to 782d; however, this embodiment is not limited thereto.

The insulating layer 784a is provided over a region of the semiconductor layer 780 which is between the insulating region 781a and the insulating region 781b. The insulating layer 784a functions as a gate insulating layer of the p-channel transistor.

The insulating layer 784b is provided over a region of the semiconductor layer 780 which is between the insulating region 781b and the insulating region 781c. The insulating layer 784b functions as a gate insulating layer of the n-channel transistor.

Each of the insulating layers 784a and 784b can be, for example, a layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic). Alternatively, each of the insulating layers 784a and 784b can be formed using a stack of materials that can be used for the insulating layers 784a and 784b.

The conductive layer 785a overlaps with the semiconductor layer 780 with the insulating layer 784a provided therebetween. A region of the semiconductor layer 780 which overlaps with the conductive layer 785a is a channel formation region of the p-channel transistor. The conductive layer 785a functions as a gate of the p-channel transistor.

The conductive layer 785b overlaps with the semiconductor layer 780 with the insulating layer 784b provided therebetween. A region of the semiconductor layer 780 which overlaps with the conductive layer 785b is a channel formation region of the n-channel transistor. The conductive layer 785b functions as a gate of the n-channel transistor.

Each of the conductive layers 785a and 785b can be, for example, a layer of a metal material such as molybdenum, magnesium, titanium, chromium, tantalum, tungsten, aluminum, copper, neodymium, or scandium or an alloy material containing any of these materials as a main component. Alternatively, each of the conductive layers 785a and 785b can be formed using a stack of materials that can be used for the conductive layers 785a and 785b.

The insulating layer 786a is provided over the insulating layer 784a and is in contact with one of a pair of side surfaces of the conductive layer 785a which face each other.

The insulating layer 786b is provided over the insulating layer 784a and is in contact with the other of the pair of side surfaces of the conductive layer 785a which face each other.

The insulating layer 786c is provided over the insulating layer 784b and is in contact with one of a pair of side surfaces of the conductive layer 785b which face each other.

The insulating layer 786d is provided over the insulating layer 784b and is in contact with the other of the pair of side surfaces of the conductive layer 785b which face each other.

The insulating layer 788 is provided over the insulating layer 786a, the insulating layer 786b, the insulating layer 786c, and the insulating layer 786d.

Each of the insulating layers 786a to 786d and the insulating layer 788 can be a layer of any of the materials that can be used for the insulating layers 784a and 784b, which may be the same as or different from the material used for the insulating layers 784a and 784b. Alternatively, each of the insulating layers 786a to 786d and the insulating layer 788 can be formed using a stack of layers of materials that can be used for the insulating layers 786a to 786d and the insulating layer 788.

The semiconductor layer 753 is provided over the insulating layer 788. The semiconductor layer 753 includes a region 752a and a region 752b. The region 752a and the region 752b are regions to which a dopant is added, and function as a source region and a drain region. As the dopant, any of the dopants that can be used for the transistor including an oxide semiconductor layer in the above embodiment can be used as appropriate. Note that the region 752a and the region 752b are not necessarily provided.

The semiconductor layer 753 can be a layer of a material that can be used for the semiconductor layer 603(a) illustrated in FIG. 6A, for example.

The insulating layer 755 is provided over the semiconductor layer 753. The insulating layer 755 functions as a gate insulating layer of the transistor.

The insulating layer 755 can be a layer of a material that can be used for the insulating layer 602(a) illustrated in FIG. 6A, for example. Alternatively, the insulating layer 755 may be formed using a stack of materials that can be used for the insulating layer 755.

The conductive layer 756 overlaps with the semiconductor layer 753 with the insulating layer 755 interposed therebetween. The conductive layer 756 functions as a gate of the transistor.

The conductive layer 756 can be a layer of a material that can be used for the conductive layer 601(a) illustrated in FIG. 6A, for example. Alternatively, the conductive layer 756 may be formed using a stack of materials that can be used for the conductive layer 756.

The insulating layer 757a and the insulating layer 757b are provided over the insulating layer 755 and in contact with side surfaces of the conductive layer 756. Note that the insulating layer 757a and the insulating layer 757b are not necessarily provided.

The conductive layer 754a is in contact with and electrically connected to the semiconductor layer 753. The conductive layer 754a is electrically connected to the conductive layer 785a. The conductive layer 754a functions as a source or a drain of the transistor including an oxide semiconductor layer.

The conductive layer 754b is in contact with and electrically connected to the semiconductor layer 753. The conductive layer 754b functions as the source or the drain of the transistor including an oxide semiconductor layer.

Each of the conductive layers 754a and 754b can be, for example, a layer of a material that can be used for the conductive layers 605a(a) and 605b(a) illustrated in FIG. 6A. Alternatively, each of the conductive layers 754a and 754b may be formed using a stack of layers of materials that can be used for the conductive layers 754a and 754b.

The insulating layer 758 is provided over the conductive layer 756, the insulating layer 757a, the insulating layer 757b, the conductive layer 754a, and the conductive layer 754b.

The insulating layer 758 can be a layer of a material that can be used for the insulating layer 602(a) illustrated in FIG. 6A, for example. Alternatively, the insulating layer 758 may be formed using a stack of materials that can be used for the insulating layer 758. The insulating layer 758 functions as a protective layer suppressing entry of an impurity.

The insulating layer 759 is provided over the insulating layer 758.

The insulating layer 759 can be a layer of a material that can be used for the insulating layer 602(a) illustrated in FIG. 6A, for example. Alternatively, the insulating layer 759 can be formed using a stack of materials that can be used for the insulating layer 759.

The conductive layer 760a is electrically connected to the conductive layer 754a through an opening formed in the insulating layer 758 and the insulating layer 759. The conductive layer 760a functions as the source or the drain of the transistor including an oxide semiconductor layer.

The conductive layer 760b is electrically connected to the conductive layer 754b through an opening formed in the insulating layer 758 and the insulating layer 759. The conductive layer 760b functions as the source or the drain of the transistor including an oxide semiconductor layer.

Each of the conductive layers 760a and 760b can be, for example, a layer of a material that can be used for the conductive layers 605a(a) and 605b(a) illustrated in FIG. 6A. Alternatively, each of the conductive layers 760a and 760b may be formed using a stack of materials that can be used for the conductive layers 760a and 760b.

Note that, here, the capacitor 281 and the capacitor 291 are not shown for simplicity, but may be formed using the following layers: any two of the conductive layers and the semiconductor layers to which a dopant is added which are included in the n-channel transistor, the p-channel transistor, and the transistor including an oxide semiconductor layer, and any insulating layer interposed between the two layers. Alternatively, the capacitor 281 and the capacitor 291 may be provided above the transistor including an oxide semiconductor layer.

The above is the description of the example of the structure of the memory cell illustrated in FIG. 8.

As described with reference to FIG. 8, in the example of the structure of the memory cell in this embodiment, the memory cell is formed by stacking transistors which include semiconductor layers formed using different materials, whereby the circuit area can be reduced.

This embodiment can be combined with any of the other embodiments disclosed in this specification as appropriate.

(Embodiment 5)

In this embodiment, an oxide semiconductor including a crystal with c-axis alignment, which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). Such an oxide semiconductor is also referred to as a c-axis aligned crystalline oxide semiconductor (CAAC-OS).

In a broad sense, a CAAC-OS means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not a single crystal oxide, but this does not mean that the CAAC-OS is composed of only an amorphous component. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

Nitrogen may be substituted for part of oxygen included in the CAAC-OS. The c-axes of the crystalline parts included in the CAAC-OS may be aligned in a certain direction (e.g., a direction perpendicular to a surface of a substrate over which the CAAC-OS is formed or a surface of the CAAC-OS). The normals of the a-b planes of the crystalline parts included in the CAAC-OS may be aligned in a certain direction (e.g., a direction perpendicular to a surface of a substrate over which the CAAC-OS is formed or a surface of the CAAC-OS).

The CAAC-OS becomes a conductor, a semiconductor, or an insulator depending on its composition or the like. The CAAC-OS transmits or does not transmit visible light depending on its composition or the like.

An example of such a CAAC-OS is an oxide which is formed into a film shape and has a triangular or hexagonal atomic arrangement when observed from the direction perpendicular to a surface of the film or a surface of a substrate over which the film is formed, and in which metal atoms are arranged in a layered manner or metal atoms and oxygen atoms (or nitrogen atoms) are arranged in a layered manner when a cross section of the film is observed.

An example of a crystal structure of the CAAC-OS will be described in detail with reference to FIGS. 9A to 9E, FIGS. 10A to 10C, FIGS. 11A to 11C, and FIGS. 12A and 12B. In FIGS. 9A to 9E, FIGS. 10A to 10C, FIGS. 11A to 11C, and FIGS. 12A and 12B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 9A to 9E, 0 surrounded by a circle represents tetracoordinate O and a double circle represents tricoordinate O.

Figure 9A:
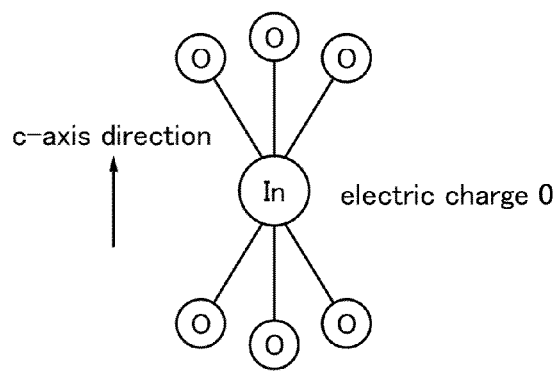
FIGS. 9A to 9E each illustrate a crystal structure of an oxide material.

FIG. 9A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 9A is actually an octahedral structure, but is illustrated as a planar structure for simplicity. Note that three tetracoordinate O atoms exist in each of an upper half and a lower half in FIG. 9A. In the small group illustrated in FIG. 9A, electric charge is 0.

Figure 9D:
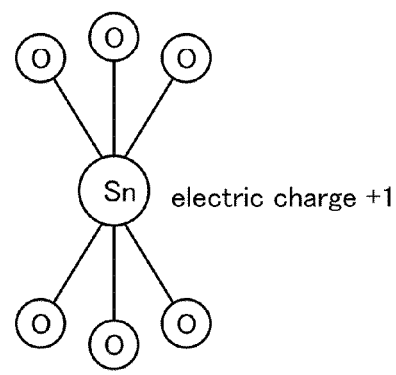
Figure 9B:
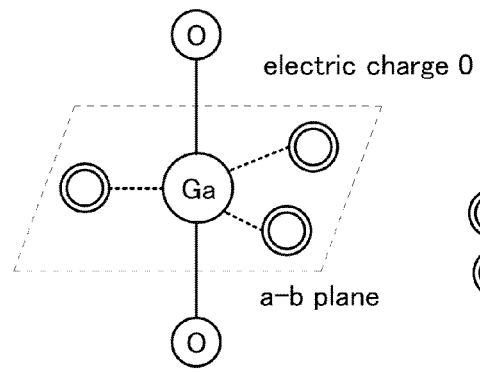

FIG. 9B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 9B. An In atom can also have the structure illustrated in FIG. 9B because an In atom can have five ligands. In the small group illustrated in FIG. 9B, electric charge is 0.

Figure 9E:
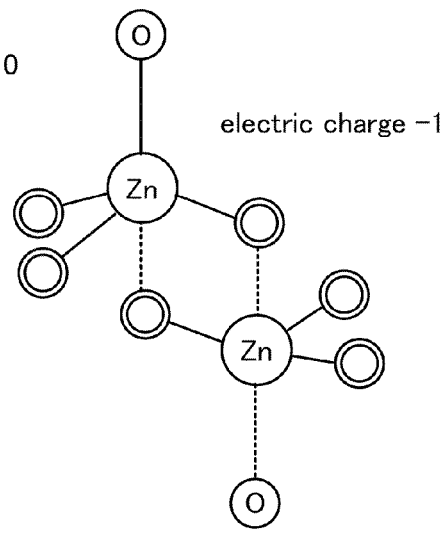
Figure 9C:
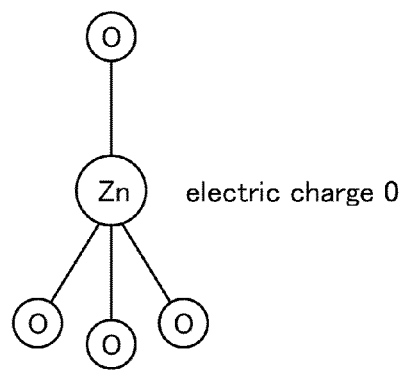

FIG. 9C illustrates a structure including one tetracoordinate Zn atom and four tetracoordinate O atoms proximate to the Zn atom. In FIG. 9C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 9C. In the small group illustrated in FIG. 9C, electric charge is 0.

FIG. 9D illustrates a structure including one hexacoordinate Sn atom and six tetracoordinate O atoms proximate to the Sn atom. In FIG. 9D, three tetracoordinate O atoms exist in each of an upper half and a lower half In the small group illustrated in FIG. 9D, electric charge is +1.

FIG. 9E illustrates a small group including two Zn atoms. In FIG. 9E, one tetracoordinate O atom exists in each of an upper half and a lower half In the small group illustrated in FIG. 9E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 9A has three proximate In atoms in the downward direction, and the three O atoms in the lower half has three proximate In atoms in the upward direction. The one O atom in the upper half with respect to the pentacoordinate Ga atom in FIG. 9B has one proximate Ga atom in the downward direction, and the one O atom in the lower half has one proximate Ga atom in the upward direction. The one O atom in the upper half with respect to the tetracoordinate Zn atom in FIG. 9C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 10A illustrates a model of a medium group included in a layered structure of an In—Sn—Zn—O-based material. FIG. 10B illustrates a large group including three medium groups. Note that FIG. 10C illustrates an atomic arrangement in the case where the layered structure in FIG. 10B is observed from the c-axis direction.

In FIG. 10A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 10A, one tetracoordinate O atom existing in each of an upper half and a lower half with respect to an In atom is denoted by circled 1. FIG. 10A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 10A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 9E can be given. For example, with one small group including two Zn atoms, electric charge of one small group including a Sn atom can be cancelled, so that the total electric charge of the layered structure can be 0.

When the large group illustrated in FIG. 10B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

Figure 11A:
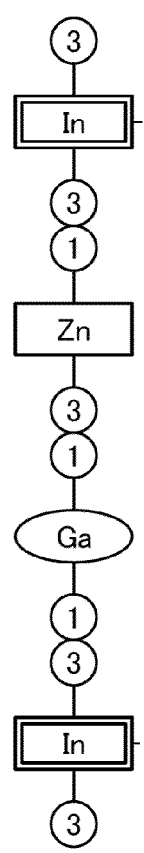
FIGS. 11A to 11C illustrate a crystal structure of an oxide material

As an example, FIG. 11A illustrates a model of a medium group included in a layered structure of an In—Ga—Zn—O-based material.

In the medium group included in the layered structure of the In—Ga—Zn—O-based material in FIG. 11A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 11B:
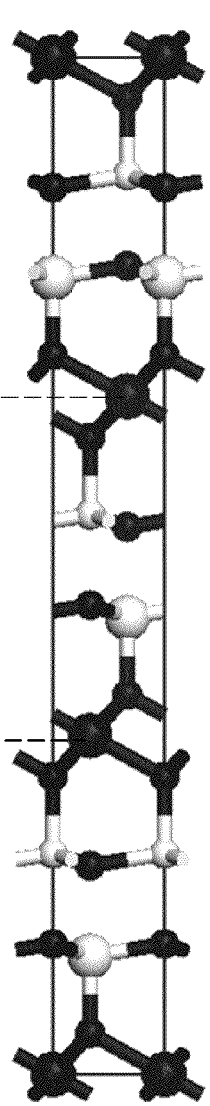
Figure 11C:
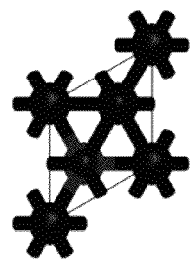

FIG. 11B illustrates a large group including three medium groups. Note that FIG. 11C illustrates an atomic arrangement in the case where the layered structure in FIG. 11B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 11A but also a medium group in which the arrangement of the In atom, the Ga atom, and the Zn atom is different from that in FIG. 11A.

When the large group illustrated in FIG. 11B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 12A:
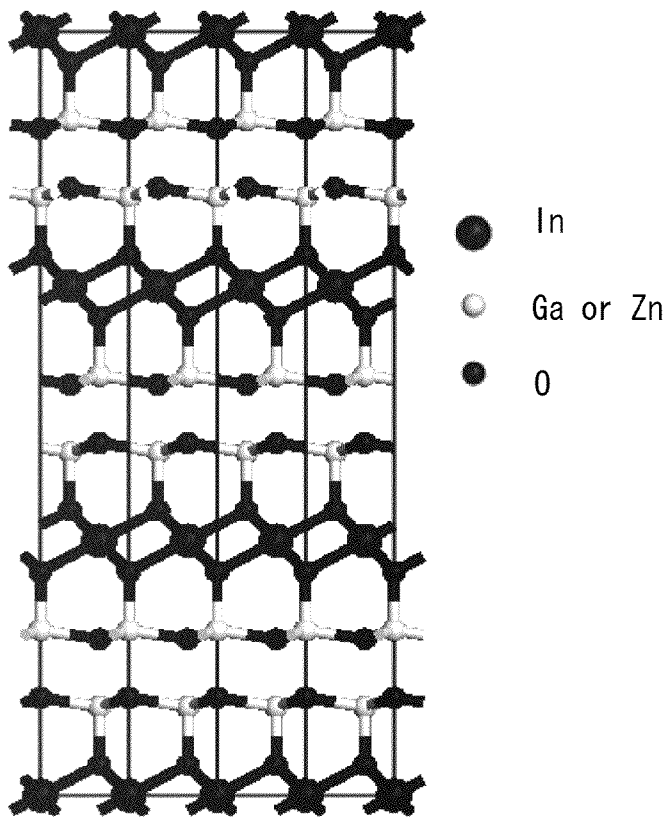
FIGS. 12A and 12B each illustrate a crystal structure of an oxide material.

In the case where n=1 ($InGaZnO_4$), a crystal structure illustrated in FIG. 12A can be obtained, for example. Note that in the crystal structure in FIG. 12A, since a Ga atom and an In atom each have five ligands as described with FIG. 9B, a structure in which Ga is replaced with In can be obtained.

Figure 12B:
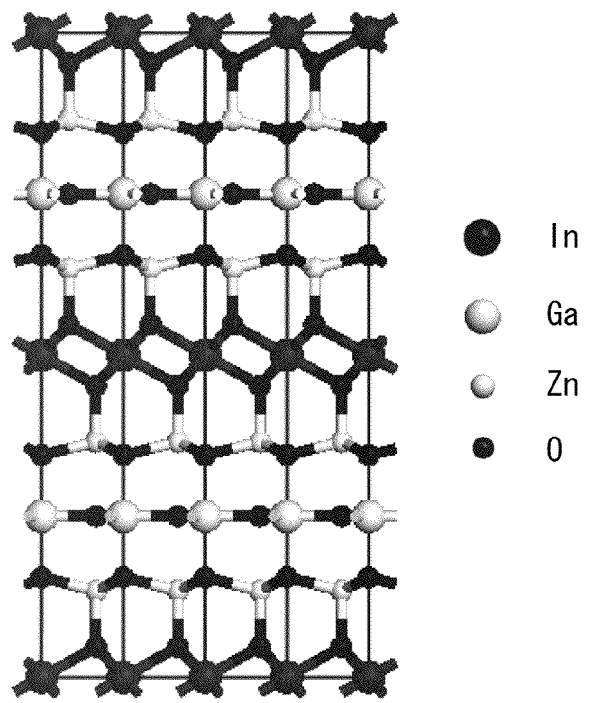

In the case where n=2 ($InGaZn_2O_5$), a crystal structure illustrated in FIG. 12B can be obtained, for example. Note that in the crystal structure in FIG. 12B, since a Ga atom and an In atom each have five ligands as described with FIG. 9B, a structure in which Ga is replaced with In can be obtained.

This embodiment can be combined with any of the other embodiments disclosed in this specification as appropriate.

(Embodiment 6)

In this embodiment, examples of electronic devices each provided with the cache memory according to any of the above embodiments are described.

Structural examples of the electronic devices according to this embodiment will be described with reference to FIGS. 13A to 13D.

Figure 13A:
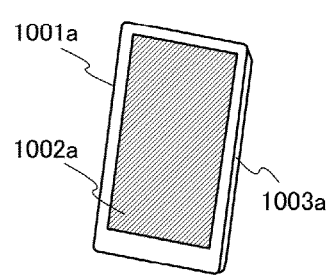
FIGS. 13A to 13D each illustrate an electronic device according to one embodiment of the present invention.

An electronic device in FIG. 13A is an example of a portable information terminal. The portable information terminal in FIG. 13A includes a housing 1001a and a display portion 1002a provided in the housing 1001a.

Note that a side surface 1003a of the housing 1001a may be provided with a connection terminal for connecting the portable information terminal to an external device and/or a button used to operate the portable information terminal in FIG. 13A.

In the housing 1001a of the portable information terminal illustrated in FIG. 13A, a CPU, a memory circuit, an interface with which signals are transmitted and received between the external device and each of the CPU and the memory circuit, and an antenna which transmits and receives signals to/from the external device are provided.

The portable information terminal illustrated in FIG. 13A has a function of one or more of a telephone set, an electronic book, a personal computer, and a game machine.

Figure 13C:
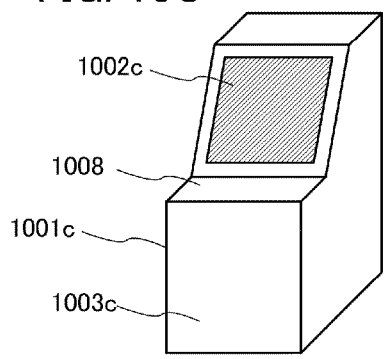
Figure 13B:
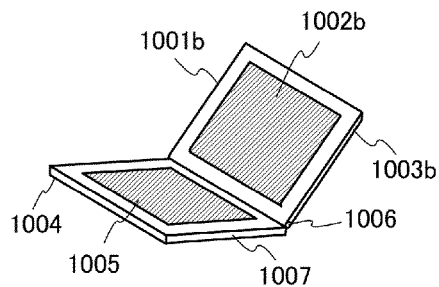

An electronic device in FIG. 13B is an example of a folding portable information terminal. The portable information terminal in FIG. 13B includes a housing 1001b, a display portion 1002b provided in the housing 1001b, a housing 1004, a display portion 1005 provided in the housing 1004, and a hinge 1006 for connecting the housing 1001b and the housing 1004.

In the portable information terminal in FIG. 13B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with a connection terminal for connecting the portable information terminal to an external device and/or a button used to operate the portable information terminal in FIG. 13B.

The display portion 1002b and the display portion 1005 may display different images or one image. Note that the display portion 1005 is not necessarily provided, and a keyboard which is an input device may be provided instead of the display portion 1005.

In the housing 1001b or the housing 1004 of the portable information terminal illustrated in FIG. 13B, a CPU, a memory circuit, and an interface with which signals are transmitted and received between the external device and each of the CPU and the memory circuit are provided. Note that the portable information terminal in FIG. 13B may be further provided with an antenna which transmits and receives signals to/from the external device.

The portable information terminal illustrated in FIG. 13B has a function of one or more of a telephone set, an electronic book, a personal computer, and a game machine.

An electronic device in FIG. 13C is an example of a stationary information terminal. The stationary information terminal in FIG. 13C includes a housing 1001c and a display portion 1002c provided in the housing 1001c.

Note that the display portion 1002c can also be provided on a deck portion 1008 of the housing 1001c.

In the housing 1001c of the stationary information terminal illustrated in FIG. 13C, a CPU, a memory circuit, and an interface with which signals are transmitted and received between the external device and each of the CPU and the memory circuit are provided. Note that the stationary information terminal in FIG. 13C may be further provided with an antenna which transmits and receives signals to/from the external device.

Further, a side surface 1003c of the housing 1001c in the stationary information terminal in FIG. 13C may be provided with one or more parts selected from a ticket ejection portion that ejects a ticket or the like, a coin slot, and a bill slot.

The stationary information terminal in FIG. 13C serves, for example, as an automated teller machine, an information communication terminal for ticketing or the like (also referred to as a multi-media station), or a game machine.

Figure 13D:
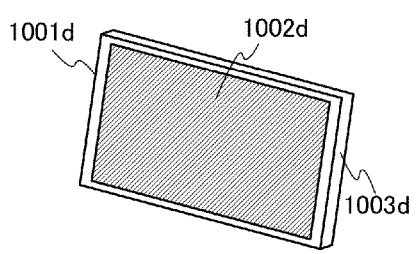

FIG. 13D illustrates an example of a stationary information terminal. The stationary information terminal in FIG. 13D includes a housing 1001d and a display portion 1002d provided in the housing 1001d. Note that a support for supporting the housing 1001d may also be provided.

Note that a side surface 1003d of the housing 1001d may be provided with a connection terminal for connecting the stationary information terminal to an external device and/or a button used to operate the stationary information terminal in FIG. 13D.

In the housing 1001d of the stationary information terminal illustrated in FIG. 13D, a CPU, a memory circuit, and an interface with which signals are transmitted and received between the external device and each of the CPU and the memory circuit may be provided. Note that the stationary information terminal illustrated in FIG. 13D may be provided with an antenna which transmits and receives signals to/from the external device.

The stationary information terminal in FIG. 13D serves, for example, as a digital photo frame, a monitor, or a television set.

The cache memory according to the above embodiment is connected to each of the CPUs in the electronic devices illustrated in FIGS. 13A to 13D.

As described with reference to FIGS. 13A to 13D, the examples of the electronic devices according to this embodiment each include the cache memory according to the above embodiment as a cache memory.

With such a structure, less power consumption is achieved and the cache hit rate is improved, whereby the operation speed of the CPU in the electronic device can be improved.

This embodiment can be combined with any of the other embodiments disclosed in this specification as appropriate.

EXPLANATION OF REFERENCE

100: cache memory, 101: control portion, 103: comparison circuit, 110: memory set, 111: memory array, 113: line, 115: tag field, 117: data field, 119: driver circuit, 150: memory cell, 151: first storage portion, 153: second storage portion, 155: data transfer portion, 160: CPU, 161: control portion, 162: arithmetic portion, 170: main memory, 251: first gate line, 252: second gate line, 253: third gate line, 254: fourth gate line, 255: first bit line, 256: second bit line, 261: transistor, 262: transistor, 263: transistor, 265: node, 266: node, 267: node, 268: node, 271: transistor, 272: transistor, 273: inverter, 274: inverter, 281: capacitor, 291: capacitor, 292: inverter, 600: element formation layer, 601: conductive layer, 602: insulating layer, 603: semiconductor layer, 604a: region, 604b: region, 605a: conductive layer, 605b: conductive layer, 606: insulating layer, 608: conductive layer, 752a: region, 752b: region, 753: semiconductor layer, 754a: conductive layer, 754b: conductive layer, 755: insulating layer, 756: conductive layer, 757a: insulating layer, 757b: insulating layer, 758: insulating layer, 759: insulating layer, 760a: conductive layer, 760b: conductive layer, 780: semiconductor layer, 781a: insulating region, 781b: insulating region, 781c: insulating region, 782a: region, 782b: region, 782c: region, 782d: region, 784a: insulating layer, 784b: insulating layer, 785a: conductive layer, 785b: conductive layer, 786a: insulating layer, 786b: insulating layer, 786c: insulating layer, 786d: insulating layer, 788: insulating layer, 1001a: housing, 1001b: housing, 1001c: housing, 1001d: housing, 1002a: display portion, 1002b: display portion, 1002c: display portion, 1002d: display portion, 1003a: side surface, 1003b: side surface, 1003c: side surface, 1003d: side surface, 1004: housing, 1005: display portion, 1006: hinge, 1007: side surface, 1008: deck portion.

This application is based on Japanese Patent Application serial no. 2011-128769 filed with Japan Patent Office on Jun. 9, 2011, the entire contents of which are hereby incorporated by reference.

The invention claimed is:

1. A semiconductor device comprising:
a memory set comprising a plurality of memory cells;
a comparison circuit electrically connected to the memory set; and
a control portion electrically connected to the memory set,
wherein each of the memory cells includes a first storage portion, a second storage portion, and a data transfer portion,
wherein the first storage portion is configured to store 1-bit data input from the control portion,
wherein the first storage portion is configured to output the 1-bit data to the comparison circuit, wherein the first storage portion is configured to output the 1-bit data to the data transfer portion,
wherein the data transfer portion is configured to transfer the 1-bit data to the second storage portion, and
wherein the second storage portion is configured to store the 1-bit data and transfer the 1-bit data to the first storage portion.

2. The semiconductor device according to claim 1,
wherein the comparison circuit is configured to detect whether first address data included in the 1-bit data matches second address data input from a CPU, and
wherein when the first address data and the second address data do not match each other, the second storage portion transfers the 1-bit data to the first storage portion and the memory set outputs the 1-bit data to the comparison circuit.

3. The semiconductor device according to claim 1,
wherein the first storage portion is electrically connected to the data transfer portion through a first transistor,
wherein the data transfer portion is electrically connected to the second storage portion through a second transistor, and
wherein the second storage portion is electrically connected to the first storage portion through a third transistor.

4. The semiconductor device according to claim 3,
wherein the first storage portion transfers the 1-bit data to the data transfer portion when the first transistor is on and the data transfer portion stores the 1-bit data when the first transistor is off,
wherein the data transfer portion transfers the 1-bit data to the second storage portion when the second transistor is on and the second storage portion stores the 1-bit data when the second transistor is off, and
wherein the second storage portion transfers the 1-bit data to the first storage portion when the third transistor is on.

5. The semiconductor device according to claim 3,
wherein the first storage portion includes two inverters which are connected to each other to form a ring,
wherein the data transfer portion includes a first capacitor having a pair of electrodes one of which is grounded,
wherein the second storage portion includes a second capacitor having a pair of electrodes one of which is grounded,
wherein the first storage portion is connected to the other electrode of the first capacitor through the first transistor,
wherein the other electrode of the first capacitor and the other electrode of the second capacitor are connected to each other through the second transistor, and
wherein the other electrode of the second capacitor is connected to the first storage portion through an inverter and the third transistor.

6. The semiconductor device according to claim 1,
wherein the plurality of memory cells is configured to form a line.

7. The semiconductor device according to claim 1,
wherein the comparison circuit includes a plurality of tag comparison circuits and a date comparison circuit.

8. The semiconductor device according to claim 3,
wherein a leakage current in an off state per micrometer of a channel width of at least one of the first transistor and the second transistor is lower than or equal to $1 \times 10^{-18}$ A.

9. The semiconductor device according to claim 3,
wherein at least one of the first transistor and the second transistor includes an oxide semiconductor.

10. A cache memory comprising the semiconductor device according to claim 1.

11. An electronic device comprising the cache memory according to claim 10.

12. A semiconductor device comprising:
a memory set comprising a plurality of lines, each of the lines including a plurality of memory cells;
a comparison circuit electrically connected to the memory set; and
a control portion electrically connected to the memory set,
wherein the memory set is configured to select one of the lines specified by the control portion,
wherein each of the memory cells includes a first storage portion, a second storage portion, and a data transfer portion,
wherein the first storage portion is configured to store 1-bit data input from the control portion,
wherein the first storage portion is configured to output the 1-bit data to the comparison circuit,
wherein the first storage portion is configured to output the 1-bit data to the data transfer portion,
wherein the data transfer portion is configured to transfer the 1-bit data to the second storage portion, and
wherein the second storage portion is configured to store the 1-bit data and transfer the 1-bit data to the first storage portion.

13. The semiconductor device according to claim 12,
wherein the comparison circuit is configured to detect whether first address data included in the 1-bit data matches second address data input from a CPU, and
wherein when the first address data and the second address data do not match each other, the second storage portion transfers the 1-bit data to the first storage portion and the memory set outputs the 1-bit data to the comparison circuit.

14. The semiconductor device according to claim 12,
wherein the first storage portion is electrically connected to the data transfer portion through a first transistor,
wherein the data transfer portion is electrically connected to the second storage portion through a second transistor, and
wherein the second storage portion is electrically connected to the first storage portion through a third transistor.

15. The semiconductor device according to claim 14,
wherein the first storage portion transfers the 1-bit data to the data transfer portion when the first transistor is on and the data transfer portion stores the 1-bit data when the first transistor is off,
wherein the data transfer portion transfers the 1-bit data to the second storage portion when the second transistor is on and the second storage portion stores the 1-bit data when the second transistor is off, and
wherein the second storage portion transfers the 1-bit data to the first storage portion when the third transistor is on.

16. The semiconductor device according to claim 14,
wherein the first storage portion includes two inverters which are connected to each other to form a ring,
wherein the data transfer portion includes a first capacitor having a pair of electrodes one of which is grounded,
wherein the second storage portion includes a second capacitor having a pair of electrodes one of which is grounded,
wherein the first storage portion is connected to the other electrode of the first capacitor through the first transistor,
wherein the other electrode of the first capacitor and the other electrode of the second capacitor are connected to each other through the second transistor, and wherein the other electrode of the second capacitor is connected to the first storage portion through an inverter and the third transistor.

17. The semiconductor device according to claim 12, wherein the comparison circuit includes a plurality of tag comparison circuits and a date comparison circuit.

18. The semiconductor device according to claim 14, wherein a leakage current in an off state per micrometer of a channel width of at least one of the first transistor and the second transistor is lower than or equal to $1\times10^{-18}$ A.

19. The semiconductor device according to claim 14, wherein at least one of the first transistor and the second transistor includes an oxide semiconductor.

20. A cache memory comprising the semiconductor device according to claim 12.

21. An electronic device comprising the cache memory according to claim 20.

22. A method for driving a semiconductor device, the semiconductor device comprising a memory set including a plurality of lines, a control portion, and a comparison circuit, wherein each of the lines includes a plurality of memory cells, and wherein each of the memory cells includes a first storage portion, a second storage portion and a data transfer portion, the method comprising the steps of:
   selecting one of the lines specified by the control portion;
   outputting, to the comparison circuit, a first data group output from the first storage portions of the plurality of the memory cells included in the one of the lines;
   comparing first address data included in the first data group with second address data input from a CPU by the comparison circuit; and
   detecting whether the first address data matches the second address data.

23. The method for driving the semiconductor device according to claim 22,
   wherein the first storage portion is electrically connected to the data transfer portion through a first transistor,
   wherein the data transfer portion is electrically connected to the second storage portion through a second transistor, and
   wherein the second storage portion is electrically connected to the first storage portion through a third transistor.

24. The method for driving the semiconductor device according to claim 23,
   wherein the first storage portion transfers the 1-bit data to the data transfer portion when the first transistor is on and the data transfer portion stores the 1-bit data when the first transistor is off,
   wherein the data transfer portion transfers the 1-bit data to the second storage portion when the second transistor is on and the second storage portion stores the 1-bit data when the second transistor is off, and
   wherein the second storage portion outputs the 1-bit data to the first storage portion when the third transistor is on.

25. The method for driving the semiconductor device according to claim 23,
   wherein the first storage portion includes two inverters which are connected to each other to form a ring,
   wherein the data transfer portion includes a first capacitor having a pair of electrodes one of which is grounded,
   wherein the second storage portion includes a second capacitor having a pair of electrodes one of which is grounded,
   wherein the first storage portion is connected to the other electrode of the first capacitor through the first transistor,
   wherein the other electrode of the first capacitor and the other electrode of the second capacitor are connected to each other through the second transistor, and
   wherein the other electrode of the second capacitor is connected to the first storage portion through an inverter and the third transistor.

26. The method for driving the semiconductor device according to claim 22,
   wherein the comparison circuit includes a plurality of tag comparison circuits and a date comparison circuit.

27. The method for driving the semiconductor device according to claim 23,
   wherein a leakage current in an off state per micrometer of a channel width of at least one of the first transistor and the second transistor is lower than or equal to $1\times10^{-18}$ A.

28. The method for driving the semiconductor device according to claim 23,
   wherein at least one of the first transistor and the second transistor includes an oxide semiconductor.

29. A cache memory comprising the semiconductor device according to claim 22.

30. A method for driving a semiconductor device, the semiconductor device comprising a memory set including a plurality of lines, a control portion, and a comparison circuit, wherein each of the lines includes a plurality of memory cells, and wherein each of the memory cells includes a first storage portion, a second storage portion and a data transfer portion, the method comprising the steps of:
   selecting one of the lines specified by the control portion;
   outputting, to the comparison circuit, a first data group output from the first storage portions of the plurality of the memory cells included in the one of the lines;
   comparing first address data included in the first data group with second address data input from a CPU by the comparison circuit to detect whether the first address data matches the second address data;
   outputting, from the comparison circuit to the CPU, a cache hit signal and main data included in the first data group, when the first address data matches the second address data; and
   outputting data of the second storage portion to the first storage portion and outputting, from the memory set to the comparison circuit, a second data group output from the first storage portions in the plurality of memory cells, when the first address data does not match the second address data.

31. The method for driving the semiconductor device according to claim 30,
   wherein the first storage portion is electrically connected to the data transfer portion through a first transistor,
   wherein the data transfer portion is electrically connected to the second storage portion through a second transistor, and
   wherein the second storage portion is electrically connected to the first storage portion through a third transistor.

32. The method for driving the semiconductor device according to claim 31,
   wherein the first storage portion transfers the 1-bit data to the data transfer portion when the first transistor is on and the data transfer portion stores the 1-bit data when the first transistor is off,
   wherein the data transfer portion transfers the 1-bit data to the second storage portion when the second transistor is on and the second storage portion stores the 1-bit data when the second transistor is off, and wherein the second storage portion outputs the 1-bit data to the first storage portion when the third transistor is on.

33. The method for driving the semiconductor device according to claim 31,
- wherein the first storage portion includes two inverters which are connected to each other to form a ring,
- wherein the data transfer portion includes a first capacitor having a pair of electrodes one of which is grounded,
- wherein the second storage portion includes a second capacitor having a pair of electrodes one of which is grounded,
- wherein the first storage portion is connected to the other electrode of the first capacitor through the first transistor,
- wherein the other electrode of the first capacitor and the other electrode of the second capacitor are connected to each other through the second transistor, and
- wherein the other electrode of the second capacitor is connected to the first storage portion through an inverter and the third transistor.

34. The method for driving the semiconductor device according to claim 30,
- wherein the comparison circuit includes a plurality of tag comparison circuits and a date comparison circuit.

35. The method for driving the semiconductor device according to claim 31,
- wherein a leakage current in an off state per micrometer of a channel width of at least one of the first transistor and the second transistor is lower than or equal to $1\times10^{-18}$ A.

36. The method for driving the semiconductor device according to claim 31,
- wherein at least one of the first transistor and the second transistor includes an oxide semiconductor.

37. A cache memory comprising the semiconductor device according to claim 30.

* * * * *